(12) United States Patent
La Rosa et al.

(10) Patent No.: US 10,771,075 B2
(45) Date of Patent: Sep. 8, 2020

(54) ANALOG-TO-DIGITAL AND DIGITAL-TO-ANALOG CONVERTER, RELATED INTEGRATED CIRCUIT, ELECTRONIC SYSTEM AND METHOD

(71) Applicant: STMicroelectronics S.r.l., Agrate Brianza (MB) (IT)

(72) Inventors: Manuela La Rosa, Gravina di Catania (IT); Giovanni Sicurella, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/422,416

(22) Filed: May 24, 2019

(65) Prior Publication Data
US 2019/0372579 A1   Dec. 5, 2019

(30) Foreign Application Priority Data

Jun. 4, 2018   (IT) .................... 102018000006005

(51) Int. Cl.
  *H03M 1/02* (2006.01)
  *H03M 1/12* (2006.01)
  *H03M 1/66* (2006.01)

(52) U.S. Cl.
  CPC ............. *H03M 1/02* (2013.01); *H03M 1/124* (2013.01); *H03M 1/1215* (2013.01); *H03M 1/66* (2013.01)

(58) Field of Classification Search
  CPC .......... H03M 1/02; H03M 1/66; H03M 1/124; H03M 1/1215; H03M 1/56; H03M 1/825; H03K 3/0315

USPC ............. 341/140–155; 327/141, 142; 331/57
See application file for complete search history.

(56) References Cited

U.S. PATENT DOCUMENTS

| 3,609,403 | A | * | 9/1971 | Eberle | ..................... H02H 3/044 |
| | | | | | 327/129 |
| 4,020,366 | A | * | 4/1977 | Garner | ..................... H03K 7/06 |
| | | | | | 327/114 |
| 4,030,040 | A | * | 6/1977 | Harbert | ..................... H04B 1/16 |
| | | | | | 327/40 |
| 4,057,761 | A | * | 11/1977 | Harbert | .................. H04B 7/082 |
| | | | | | 327/40 |
| 4,445,111 | A | | 4/1984 | Swift et al. | |
| 4,517,532 | A | * | 5/1985 | Neidorff | .............. H03K 3/0315 |
| | | | | | 331/108 C |
| 5,373,292 | A | | 12/1994 | Yasuda | |
| 9,007,133 | B2 | | 4/2015 | Crennonesi et al. | |

(Continued)

*Primary Examiner* — Lam T Mai
(74) *Attorney, Agent, or Firm* — Slater Matsil, LLP

(57) ABSTRACT

A converter circuit is used to selectively convert an analog input voltage into a digital output signal or a digital input signal into an analog output voltage as a function of a mode signal. The converter circuit includes a control circuit configured to generate a start-of-conversion signal. A ramp generator is configured to, when the mode signal indicates an analog-to-digital conversion, generate a timer stop signal after a time interval that is determined as a function of the value of the analog input voltage, thereby implementing an analog-to-time conversion. When the mode signal indicates a digital-to-analog conversion, ramp generator is configured to vary the ramp signal until a ramp stop signal is set and, in response to the ramp stop signal, determine the analog output voltage as a function of the ramp signal, thereby implementing a time-to-analog conversion.

20 Claims, 12 Drawing Sheets

(56) References Cited

U.S. PATENT DOCUMENTS

| | | | | |
|---|---|---|---|---|
| 2002/0063605 A1* | 5/2002 | Boerstler | ............ | H03K 3/0315 |
| | | | | 331/57 |
| 2002/0097098 A1* | 7/2002 | Tang | ................... | H03K 3/0231 |
| | | | | 331/57 |
| 2007/0273451 A1* | 11/2007 | Osvaldella | ........... | H03K 3/0315 |
| | | | | 331/57 |
| 2008/0062752 A1* | 3/2008 | Giovinazzi | ........ | G11C 13/0028 |
| | | | | 365/163 |
| 2010/0102891 A1* | 4/2010 | Nissar | ................. | H03K 3/0315 |
| | | | | 331/57 |

\* cited by examiner

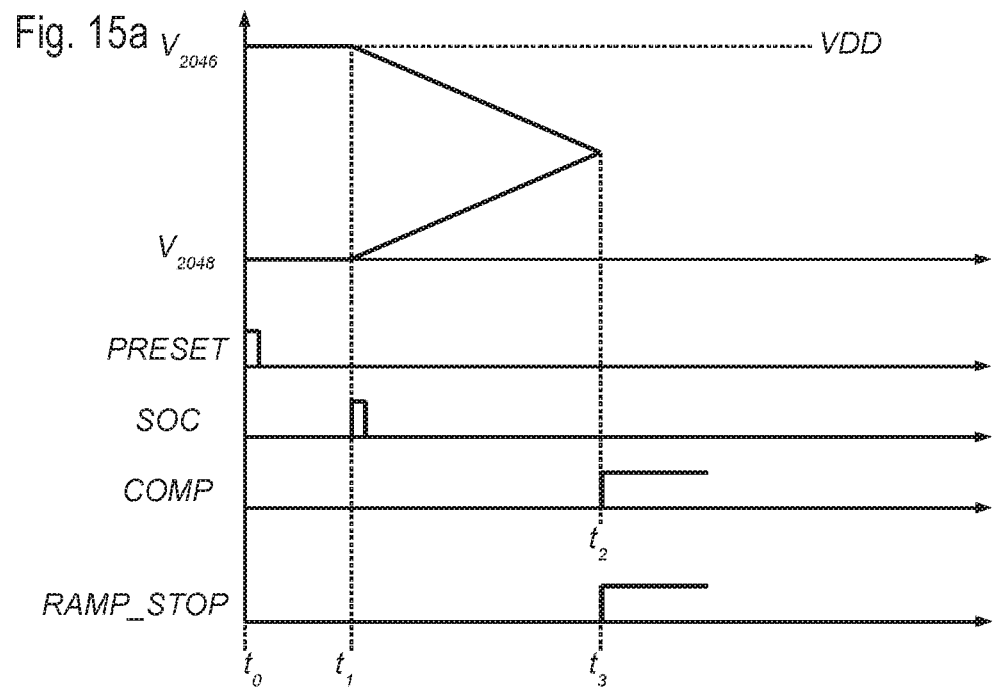
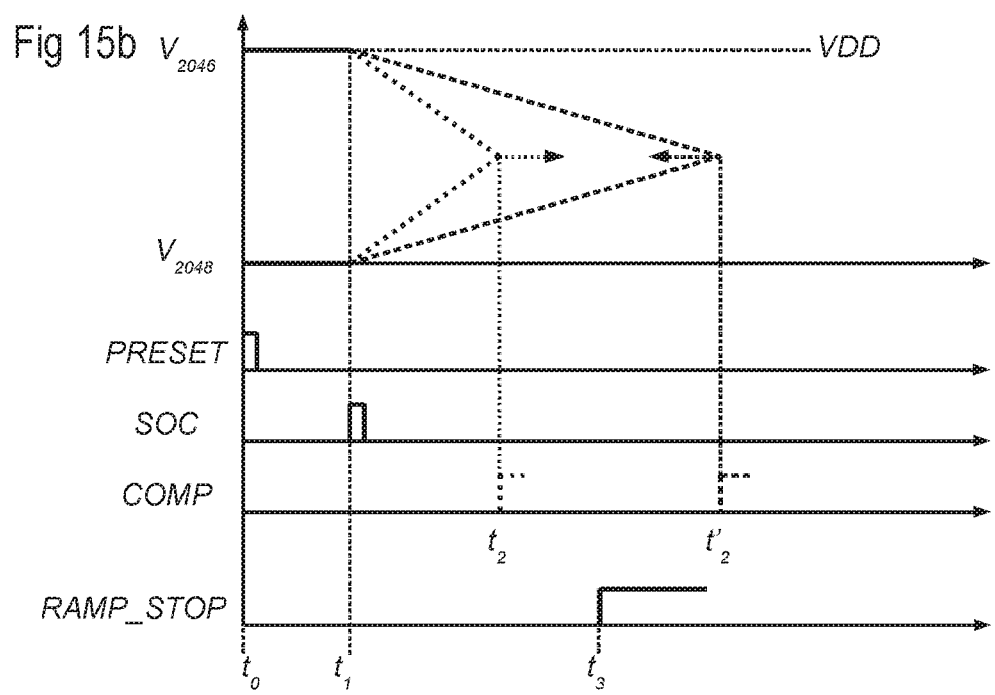

US 10,771,075 B2

ANALOG-TO-DIGITAL AND DIGITAL-TO-ANALOG CONVERTER, RELATED INTEGRATED CIRCUIT, ELECTRONIC SYSTEM AND METHOD

CROSS-REFERENCE TO RELATED APPLICATIONS

This application claims priority to Italian Patent Application No. 102018000006005, filed on Jun. 4, 2018, which application is hereby incorporated herein by reference.

TECHNICAL FIELD

Embodiments of the present disclosure relate to solutions for performing analog-to-digital and/or digital-to-analog conversions.

BACKGROUND

Analog-to-digital (A/D) and digital-to-analog (D/A) converters are broadly used in electronic systems, such as electronic control loops, and their performance in terms of space and efficiency are very challenging.

For example, instead of performing analog processing operations, often electronic systems perform digital processing operations.

For example, FIG. 1 shows an exemplary electronic system that includes an analog-to-digital converter 10 configured to generate digital samples DS_OUT of an analog input signal, such as an input voltage $V_{IN}$. A digital processing unit 12 is configured to generate a digital signal DS_IN as a function of the digital samples DS_OUT of the analog input signal and a digital-to-analog converter 14 is configured to generate an analog output signal, such as an output voltage $V_{OUT}$, as a function of the digital signal DS_IN.

For example, the digital processing circuit 12 may be a dedicated hardware circuit, a micro-processor programmed via software instructions, a programmable logic circuit, such as a Field Programmable Gate Array (FPGA), or any combination thereof. Moreover, often the A/D converter 10, the digital processing unit 12 and the D/A converter 14 are integrated in a single integrated circuit, such as a microcontroller.

Traditionally, A/D and D/A converters are two separated circuits of the electronic system. Various types of A/D and D/A converters are known in the art. For example, one kind of A/D converters is based on a time-to-digital converter (TDC). Such TDCs use internal propagation delays of signals through gates to measure time intervals with very high precision. For example, such a TDC may be used to measure the time required to charge a reference capacitor to a given threshold value via the analog input signal.

SUMMARY

Various embodiments of the present disclosure relate to an analog-to-digital and digital-to-analog converter circuit comprising a time-to-digital converter. Embodiments moreover concern a related integrated circuit, electronic system and method of operating such a converter circuit.

Various embodiments of the present disclosure relate to a converter circuit configured to selectively convert an analog input voltage into a digital output signal or a digital input signal into an analog output voltage. Specifically, in various embodiments, the conversion is performed as a function of a mode signal indicating a digital-to-analog conversion or an analog-to-digital conversion, respectively.

In various embodiments, the converter circuit comprises a timer circuit, a ramp generator and a control circuit, wherein the control circuit is configured to generate a start-of-conversion signal.

Specifically, in various embodiments, the ramp generator and the timer circuit are configured to monitor the start-of-conversion signal.

Specifically, in various embodiments, once the start-of-conversion signal is set and when the mode signal indicates an analog-to-digital conversion, the ramp generator generates by means of a variation of at least one ramp signal and a comparator a timer stop signal once a time interval determined as a function of the value of the analog input voltage has lapsed, thereby implementing an analog-to-time conversion. The timer circuit varies in parallel at least one count value until the timer stop signal is set and, in response to the timer stop signal, determines the digital output signal as a function of the at least one count value, thereby implementing a time-to-digital conversion.

Conversely, in various embodiments, once the start-of-conversion signal is set and when the mode signal indicates a digital-to-analog conversion, the timer circuit generates by means of a variation of the at least one count value a ramp stop signal once a time interval determined as a function of the value of the digital input signal has lapsed, thereby implementing a digital-to-time conversion. The ramp generator varies in parallel the at least one ramp signal until the ramp stop signal is set and, in response to the ramp stop signal, determines the analog output voltage as a function of the at least one ramp signal, thereby implementing a time-to-analog conversion.

In various embodiments, the timer circuit comprises for this purpose at least one counter providing the at least one count value and a ring oscillator. Specifically, in various embodiments, the ring oscillator comprising a first delay stage, a plurality of intermediate delay stages and a last delay stage. In various embodiments, each delay stage comprises an input terminal and an output terminal, wherein the input terminal of each intermediate delay stage is connected to the output terminal of an upstream delay stage, the output terminal of each intermediate delay stage is connected to the input terminal of a downstream delay stage and the output terminal of the last delay stage is connected to the input terminal of the first delay stage, wherein the signal at the output terminal of the last delay stage corresponds to a clock signal used to increase the at least one counter.

In various embodiments, each delay stage comprises a set-reset latch having a set terminal, a reset terminal and an output terminal, wherein the set terminal of the latch is connected to the input terminal of the respective delay stage, the reset terminal of the latch is connected to the output terminal of a downstream delay stage and the output terminal of the latch is connected to the output terminal of the respective delay stage. In various embodiments, each delay stage further comprises a delay line connected to the input terminal of the respective delay stage and providing at output a delayed version of the signal applied to the input terminal of the respective delay stage. In this case, a combinational logic circuit may be configured to generate the signal applied to the output terminal of the respective delay stage by combining the signal at the output of the delay line of the respective delay stage and the signal at the output terminal of the latch of the respective delay stage.

Accordingly, in various embodiments, in order to implement the above-mentioned time-to-digital conversion, i.e.

when the mode signal indicates an analog-to-digital conversion, the timer circuit is configured to: reset the latches of the delay stages and reset the at least one count value of the at least one counter, in response to the start-of-conversion signal, start the ring oscillator by setting the latch of the first delay stage, in response to the timer stop signal, stop the ring oscillator, and determine the digital output signal as a function of the at least one count value provided by the at least one counter and the signals at the output terminals of the latches.

For example, the digital output signal may be determined by determining the least significant bits of the digital output signal as a function of the signals at the output terminals of the latches and by determining the most significant bits of the digital output signal as a function of the at least one count value provided by the at least one counter. Specifically, in various embodiments, the least significant bits of the digital output signal are determined by searching the two consecutive delay stages, wherein the signal at the output terminal of a respective first delay stage is high and the signal at the output terminal of a respective consecutive second delay stage is low. Conversely, the most significant bits of the digital output signal may be determined by setting the most significant bits of the digital output signal to the at least one count value provided by the at least one counter.

Conversely, in various embodiments, in order to implement the above-mentioned digital-to-time conversion, i.e. when the mode signal indicates a digital-to-analog conversion, the timer circuit is configured to: reset the latches of the delay stages and set the at least one count value of the at least one counter to a respective (initial) value determined as a function of the digital input signal, in response to the start-of-conversion signal, start the ring oscillator by setting the latch of a delay stage selected amongst the delay stages as a function of the digital input signal, compare the at least one count value of the at least one counter with a reference value, e.g. by using the carry signal and/or the overflow signal of the at least one counter, and in response to the comparison, generate the ramp stop signal when the at least one count value of the at least one counter reaches the reference value.

For example, in various embodiments, the initial values of the at least one counter are set to the most significant bits of the digital input signal.

As mentioned before the ramp generator is configured to generate at least one ramp signal. For example, in various embodiments, the input voltage corresponds to the voltage difference between a first voltage and a second voltage.

In this case, when the mode signal indicates an analog-to-digital conversion, the ramp generator may apply the first voltage to a first node and apply the second voltage to a second node, in response to the start-of-conversion signal, generate a first ramp signal by linearly decreasing the voltage at the first node and generate a second ramp signal by linearly increasing the voltage at the second node, and generate via the comparator the timer stop signal when the voltage at the first node corresponds to and/or is smaller than the voltage at the second node.

Conversely, when the mode signal indicates a digital-to-analog conversion, the ramp generator may apply a first reference voltage to the first node and apply a second reference voltage to the second node, in response to the start-of-conversion signal, generate a first ramp signal by linearly decreasing the voltage at the first node and generate a second ramp signal by linearly increasing the voltage at the second node; and in response to the ramp stop signal, determine the analog output voltage as a function of the voltage at the first node and the voltage at the second node.

In various embodiments, the converter circuit may also support a calibration function. For example, in various embodiments, the control circuit is configured to: request a digital-to-analog conversion of the minimum value for the digital input signal to the converter circuit or request an analog-to-digital conversion of the maximum value for the analog input voltage to the converter circuit, determine a first instant when the ramp stop signal is set and determine a second instant when the output of the comparator is set, in case the second instant is before the first instant, decrease the delay introduced by the delay stages and/or decrease the gradient of the at least one ramp signal, and in case the second instant is after the first instant, increase the delay introduced by the delay stages and/or increase the gradient of the at least one ramp signal.

Additionally or alternatively, the control circuit may request a digital-to-analog conversion of the given value for the digital input signal to the converter circuit, thereby generating a respective analog output voltage, request an analog-to-digital conversion of the respective analog output voltage to the converter circuit (e.g. by connecting the output voltage to the input voltage of the converter circuit), thereby generating a respective digital output signal, and compare the given value for the digital input signal with the respective digital output signal.

BRIEF DESCRIPTION OF THE DRAWINGS

Embodiments of the present disclosure will now be described with reference to the annexed drawings, which are provided purely by way of non-limiting example and in which:

FIGS. 15a and 15b show embodiments of calibration methods for the conversion circuit of FIG. 14.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

As mentioned before, the present description relates to an analog-to-digital and digital-to-analog converter circuit comprising a time-to-digital converter.

Figure 2:
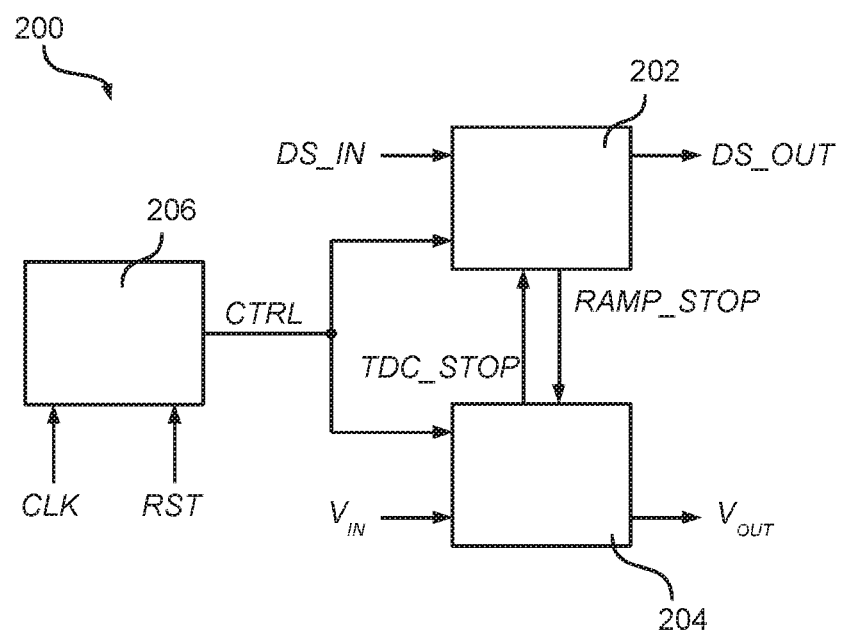
FIG. 2 shows an embodiment of an A/D and D/A conversion circuit comprising a ramp generator and a timer circuit.

FIG. 2 shows an embodiment of the general structure of a converter circuit 200 in accordance with the present disclosure.

Figure 1:
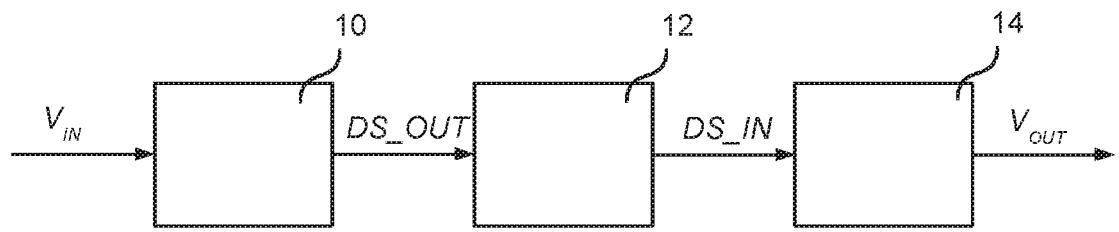
FIG. 1 shows an electronic system comprising an A/D and D/A converter.

Specifically, the converter circuit 200 shown in FIG. 2 is configured to selectively convert either an analog input voltage $V_{IN}$ into a digital output signal DS_OUT (ADC mode) or a digital input signal DS_IN into an analog output voltage $V_{OUT}$ (DAC mode). Accordingly, the converter circuit 200 may be used to implement the A/D converter 10 and D/A converter 14 shown in FIG. 1 and the respective description fully applies.

In the embodiment considered, the converter circuit 200 comprises three main blocks: a digital control circuit 206, a time-to-digital conversion (TDC) circuit 202 and a ramp generator and comparison circuit 204. Specifically, FIG. 2 shows an integrated solution for A/D and D/A conversion where the same TDC circuit 202 (also referred to as timer circuit 202) is used for both A/D and D/C conversion, thereby reducing conversion mismatch due to process variations and reducing silicon area. An example of a TDC is disclosed in U.S. Pat. No. 9,007,133, which is incorporated herein by reference.

Specifically, in the embodiment considered, the conversion circuit 200 supports two modes. In the first mode (ADC), the ramp generator and comparison circuit 204 generates at least one ramp signal as a function of the input voltage $V_{IN}$. For example, a single ramp signal may be used when a single ended input voltage $V_{IN}$ is used or two ramp signals may be used when a differential input voltage $V_{IN}$ is used. In response to the comparison, the ramp generator and comparison circuit 204 sets a timer stop signal TDC_STOP. Thus, essentially, the time required until the circuit 204 sets the timer stop signal TDC_STOP depends (amongst other parameters) on the amplitude of the voltage $V_{IN}$. In turn, the timer circuit 202 is configured to increase an internal digital count value (starting from a reset value) until the timer stop signal TDC_STOP is set. Specifically, when the timer stop signal TDC_STOP is set, the digital signal DS_OUT is set to the current value of the internal count value. Thus, essentially, also the final value of the internal count value and thus also the signal DS_OUT depends on the amplitude of the voltage $V_{IN}$.

In the second mode (DAC), the timer circuit 202 is configured to increase the internal count value until a given threshold is reached, wherein either the reset value of the internal count value or the threshold value is determined as a function of the digital signal DS_IN. Moreover, when the internal count value reaches the threshold value, the timer circuit 202 sets a ramp stop signal RAMP_STOP. Thus, essentially, the time required until the circuit 202 sets the ramp stop signal RAMP_STOP depends (amongst other parameters) on the value of the digital signal DS_IN.

In turn, the ramp generator and comparison circuit 204 generates again at least one ramp signal and, when the ramp stop signal RAMP_STOP is set, the output voltage $V_{OUT}$ is set to a value determined as a function of the one or more ramp signals. For example, a single ramp signal may be used when a single ended output voltage $V_{OUT}$ is used, e.g. the output voltage $V_{OUT}$ may be set to the value of the ramp signal when the ramp stop signal RAMP_STOP is set, or two ramp signals may be used when a differential output voltage $V_{OUT}$ should be generated, e.g. the output voltage $V_{OUT}$ may be set to the difference between a first (e.g. decreasing) and a second (e.g. increasing) ramp signal when the ramp stop signal RAMP_STOP is set. Thus, essentially, the final value of the ramp signal(s) and thus also the output voltage $V_{OUT}$ depends on the value of the digital input signal DS_IN.

In the embodiment considered, the digital control circuit 206 is thus configured to generate, in response to a system clock signal CLK and an optional reset signal RST, one or more control signals CTRL for managing the above modes of operation.

Thus, in the embodiments considered, the timer circuit 202 is essentially used as a digital-to-time converter (D/A mode) or time-to-digital converter (A/D mode). Conversely, the ramp generator 204 is used as time-to-analog converter (D/A mode) or analog-to-time converter (A/D mode).

Figure 3:
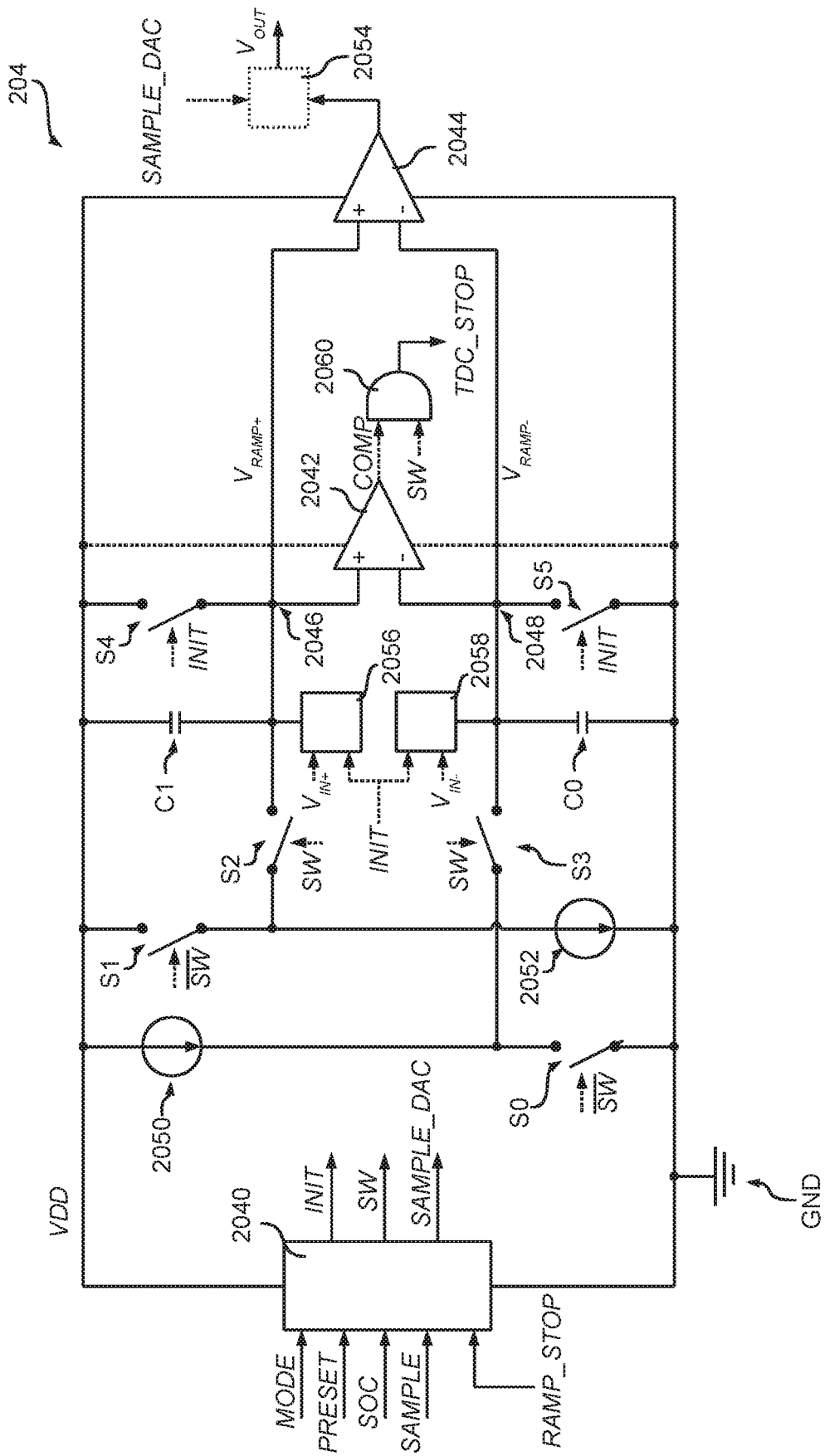
FIG. 3 shows an embodiment of the ramp generator of FIG. 2.

FIG. 3 shows an embodiment of the ramp generator 204. Specifically, in the embodiment considered, the ramp generator 204 works with differential voltages. Specifically, in the embodiment considered, a double ramp generator is used, wherein the double ramp generator 204 is configured to generate a first ramp voltage signal $V_{RAMP+}$ at a node 2046 and a second ramp voltage signal $V_{RAMP-}$ at a node 2048.

For example, in the embodiment considered, in response to an initialization signal INIT, the first voltage signal $V_{RAMP+}$ is set to a first reference voltage, e.g. a supply voltage VDD; and the second voltage signal $V_{RAMP-}$ is set to a second reference voltage, e.g. ground GND.

For example, in the embodiment considered, the first voltage signal $V_{RAMP+}$ is set to the first reference voltage via an electronic switch S4 configured to connect the node 2046 to the first reference voltage, and the second voltage signal $V_{RAMP-}$ is set to the second reference voltage via an electronic switch S5 configured to connect the node 2048 to the second reference voltage.

Once the ramp generation is started in response to a signal SW, the first voltage ramp signal $V_{RAMP+}$ is decreased linearly, and the second voltage ramp signal $V_{RAMP-}$ is increased linearly.

For example, in the embodiment considered, the ramp generator 204 comprises a capacitor C1 connected (e.g., directly) between the first reference voltage and the node 2046. Moreover, a current source 2052 is connected selectively (in response to the signal SW) via an electronic switch S2 between the node 2046 and the second reference voltage. Accordingly, once the switch S2 is closed via the signal SW, the current source 2052 discharges the capacitor C1, thereby decreasing the voltage $V_{RAMP+}$ at the node 2046.

In a complementary manner, the ramp generator 204 may comprise a capacitor C0 connected (e.g., directly) between the second reference voltage and the node 2048. Moreover, a current source 2050 may be connected selectively (in response to the signal SW) via an electronic switch S3 between the node 2048 and the first reference voltage. Accordingly, once the switch S3 is closed via the signal SW, the current source 2050 charges the capacitor C0, thereby increasing the voltage $V_{RAMP-}$ at the node 2048.

In various embodiment, the ramp generator 204 may also comprise recirculation switches S0 and S1, which connect the current source 2050 and the current source 2052 between the first and the second reference voltage, respectively, when the signal SW is not set.

Accordingly, by controlling the duration of the time interval in which the signal SW is set (i.e., when the voltage $V_{RAMP+}$ decreases and the voltage $V_{RAMP-}$ increases), it is possible to set the voltage difference between the nodes 2046 and 2048, thereby implementing a digital-to-analog conversion.

In various embodiments, the voltage between the nodes 2046 and 2048 is not used directly as output voltage $V_{OUT}$, but the nodes 2046 and 2048 are connected to the input terminals of a voltage differential amplifier 2044, which provides at output the output voltage $V_{OUT}$.

In various embodiments, an analog sample-and-hold circuit 2054 may be connected between the output terminal of the amplifier 2044 and the output voltage $V_{OUT}$. Specifically, in various embodiments, the sample-and-hold circuit 2054 samples the voltage at the output of the amplifier 2044 in response to a sampling signal SAMPLE_DAC. For example, the circuit 2054 may comprise for this purpose a voltage follower configured to selectively sample (as a function of the signal SAMPLE_DAC) the voltage at the output of the amplifier 2044.

In various embodiments the various control signals INIT, SW and SAMPLE_DAC are generated by a control circuit 2040 as a function of the control signals CTRL provided by the control circuit 206 and the ramp stop signal RAMP_STOP provided by the timer circuit 204. Generally, the control circuit 2040 may also be integrated in the control circuit 206.

For example, in various embodiments, the control circuit 206 is configured to generate a mode control signal MODE, which is used to select either the ADC mode (e.g. MODE="0") or the DAC mode (e.g. MODE="1").

In various embodiments, the control circuit 206 may generate a preset signal PRESET, which may be used to initialize the time-to-digital conversion circuit 202 and the ramp generator 204.

In various embodiments, the control circuit 206 may generate a start of conversion signal SOC, which signals to the time-to-digital conversion circuit 202 and the ramp generator 204 that a new conversion (as specified by the mode signal MODE) should be started.

Finally, in various embodiments, the control circuit 206 generates a sample signal SAMPLE. Specifically, in the embodiment considered, the signal SAMPLE may be used to enable the sampling of the output voltage $V_{OUT}$ (DAC mode) or store the signal DS_OUT (ADC mode) (as will be described in greater detail in the following).

Accordingly, in the embodiment considered, when the mode signal MODE indicates a D/A conversion, the control circuit 2040 may set the signal INIT in response to the signal PRESET, thereby setting the initial voltages at the nodes 2046 and 2048. Next, in response to the start-of-conversion signal SOC, the control circuit 2040 may set the signal SW, thereby generating the ramp signals at the nodes 2046 and 2048. As mentioned before, in parallel is operated the timer circuit 202 and the timer circuit 202 signals the end of the conversion via the ramp stop signal RAMP_STOP, wherein the time until the stop signal RAMP_STOP is set depends on the digital input signal DS_IN. Accordingly, in response to the signal RAMP_STOP, the control circuit 2040 may reset the signal SW, thereby maintaining the voltage at the nodes 2046 and 2048 constant. Finally, in response to the signal SAMPLE, the control circuit 2040 may set the signal SAMPLE_DAC in order to transfer the voltage at the output of the amplifier 2044 to the output voltage $V_{OUT}$.

Conversely, when the mode signal indicates an A/D conversion, the ramp generator 204 should compare at least one of the ramp signals with the input voltage $V_{IN}$. Specifically, in a differential architecture, the input voltage corresponds to a voltage $V_{IN}=V_{IN+}-V_{IN-}$. Accordingly, one of the ramp signals could be compared sequentially with the voltages $V_{IN+}$ and $V_{IN-}$. However, by using two ramp generators, the voltage at the node 2046 may be compared with the voltage at the node 2048, i.e. the voltage at the node 2048 may be used as reference voltage for the voltage 2046, thereby avoiding a sequential comparison of the ramp signal.

Specifically, in this case, instead of initializing the voltage $V_{RAMP+}$ at the node 2046 to the first reference voltage, the voltage $V_{RAMP+}$ at the node 2046 is initialized to the voltage $V_{IN+}$. Similarly, the voltage $V_{RAMP-}$ at the node 2048 is initialized to the voltage $V_{IN-}$. For example, in the embodiment considered, in response to the signal INIT, the voltage $V_{IN+}$ may be applied via a circuit 2056 to the node 2046 (i.e. the capacitor C1) and the voltage $V_{IN-}$ may be applied via a circuit 2058 to the node 2048 (i.e. the capacitor C0). For example, the circuits 2056 and 2058 may comprise for this purpose a voltage follower configured to selectively apply (as a function of the signal INIT) the voltage $V_{IN+}$ or $V_{IN-}$ to the node 2046 or 2048, respectively.

Accordingly, once the ramp generation is activated by setting the signal SW, the voltage $V_{RAMP+}$ decreases (staring from the voltage $V_{IN+}$) and the voltage $V_{RAMP-}$ increases (staring from the voltage $V_{IN-}$).

In the embodiment considered, the voltages $V_{RAMP+}$ and $V_{RAMP-}$ are provided at input to an analog comparator 2042. Accordingly, the output of the comparator 2042 changes when the voltages $V_{RAMP+}$ and $V_{RAMP-}$ correspond, i.e. when the voltage difference between the nodes 2046 and 2048 is zero (or similarly when the voltage $V_{RAMP+}$ is smaller than the voltage $V_{RAMP-}$). Specifically, the time required until the output of the comparator 2042 is set is thus proportional to the value of the input voltage $V_{IN}$. Accordingly, the output of the comparator 2042 may be used to signal the end of the A/D conversion, i.e. the timer stop signal TDC_STOP may be determined as a function of a signal COMP at the output of the comparator 2042. For example, in the embodiment considered, the timer stop signal TDC_STOP is determined via an optional AND gate 2060, which combines the signal COMP at the output of the comparator 2042 and the signal SW.

Generally, when using single ended voltages, also only a single ramp generator may be used, e.g., the second ramp generator connected to the node 2048 (current source 2050, switch S3, and possibly also capacitor C0) may be omitted and the node 2048 may be maintained at a constant value; or the first ramp generator connected to the node 2046 (current source 2052, switch S2, and possibly also capacitor C1) may be omitted and the node 2046 may be maintained at a constant value.

Accordingly, in the embodiment considered, when the mode signal MODE indicates an A/D conversion, the control circuit 2040 may set the signal INIT in response to the signal PRESET, thereby setting the initial voltage at the nodes 2046 and 2048 to the voltages $V_{IN+}$ and $V_{IN-}$, respectively. Next, in response to the start-of-conversion signal SOC, the control circuit 2040 may set the signal SW, thereby generating the ramp signals at the nodes 2046 and 2048. As mentioned before, in parallel is started the timer circuit 202. Once the comparator signals that the voltages $V_{RAMP+}$ and $V_{RAMP-}$ correspond, the circuit 204 sets via the comparator 2042 the timer stop signal TDC_STOP, and the timer circuit 202 stops in response to the signal TDC_STOP. Finally, in response to the signal SAMPLE, the timer circuit 202 may sample the internal count value, thereby providing the digital sample DS_OUT indicative of the input voltage $V_{IN}$.

Accordingly, when the converter 200 is operated in A/D mode, the double ramp generator 204 of FIG. 3 is configured to convert the (differential) input voltage $V_{IN}$ in a proportional time interval, which corresponds to the time between the instant when the start of conversion signal SOC is set (e.g. the rising edge of signal SOC) and the instant when the timer stop signal TDC_STOP is generated by the ramp generator 204 (e.g. the rising edge of signal TDC_STOP). The duration of this time interval is converter by the timer circuit 202 into a digital signal, i.e. the signal DS_OUT has a value being proportional to the duration of the time interval.

On the other hand, when the converter 200 is operated in D/A mode, the timer circuit 202 is configured to convert the digital input signal DS_IN in a proportional time interval, which corresponds to the time between the instant when the start of conversion signal SOC is set (e.g. the rising edge of signal SOC) and the instant when the ramp stop signal RAMP_STOP is generated by the timer circuit 202 (e.g. the rising edge of signal RAMP_STOP). The duration of this time interval is converter by the ramp generator 204 into an analog signal, i.e. the signal $V_{OUT}$ has a value being proportional to the duration of the time interval.

As mentioned before, by using an internal counter, the timer circuit 202 is operated as a digital-to-time converter (D/A mode) or time-to-digital converter (A/D mode).

Thus, in principle, the timer circuit 202 could be implemented with a digital timer circuit driven by the clock signal CLK of the control circuit 206. However, this has the disadvantage, the either only a low-resolution A/D or D/A conversion is possible, or a high frequency clock signal CLK would be required.

Conversely, in various embodiments, a timer circuit 202 is used which includes an internal ring oscillator.

In order to describe the operation of a high-resolution timer circuit, reference will first be made to a time-to-digital converter (TDC) 100.

Figure 4:
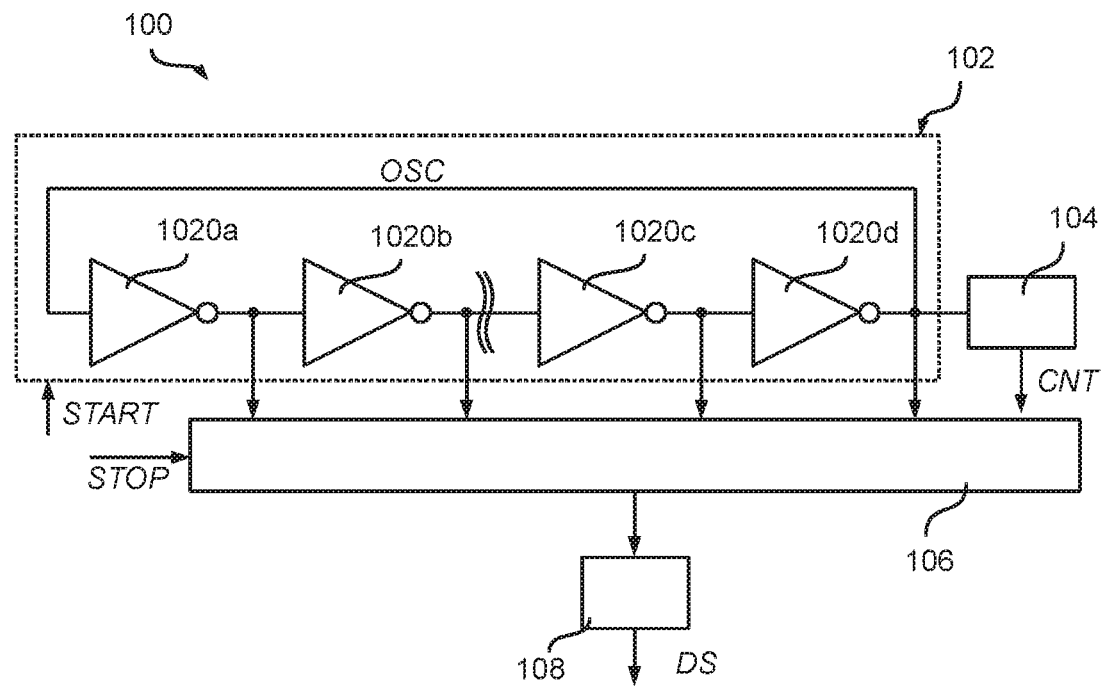
FIG. 4 shows an embodiment of a time-to-digital converter.

Specifically, FIG. 4 shows an embodiment of a TDC 100 comprising an internal oscillator 102. For example, in the embodiment considered, the oscillator 102 is a ring oscillator comprising a plurality of delay stages 1020a, 1020b ... 1020c, and 1020d connected in series to form a loop/ring. For example, in the example considered the delay stages 1020a, 1020b ... 1020c, 1020d are implemented with inverter stages.

In the embodiment considered, the oscillator 102 is started/reset in response to a start signal START indicating the start of a time interval. Similarly, the oscillator 102 may be stopped in response to a stop signal STOP indicating the end of a time interval.

The output of the oscillator 102 (corresponding, e.g., to the output of the inverter stage 1020d) corresponds thus to a clock signal OSC having a given frequency. In the embodiment considered, the clock signal OSC is used to increase a digital counter 104, i.e., the counter 104 is configured to increase a count value CNT in response to the clock signal.

Thus, in the embodiment considered, the counter 104 is increased in response to the clock signal OSC, which is generated independently from the clock signal CLK of the control circuit 206. Thus, an increase of resolution may be obtained by using a clock signal OSC having a higher frequency than the clock signal CLK. For example, this is usually possible, because the clock signal CLK is usually used to drive also other more complex digital circuits.

However, a further gain in resolution may be obtained by considering also the state of the ring oscillator when the signal STOP is set. Specifically, once a stop signal STOP indicates that the time interval has ended, a sampling circuit 106, such as a register or preferably a latch, samples the count value CNT of the counter 104 and also the state STATE of the ring oscillator, e.g. the output values of the delay stages 1020a, 1020b ... 1020c, 1020d. Thus, the count value CNT provided by the counter 104 and the switching state/position STATE of the ring oscillator 102 (as indicted by the output values of the delay stages 1020a, 1020b ... 1020c, 1020d) may be used by a processing circuit 108 to calculate a digital value DS (having a given number of bits) indicative of the duration of the time interval between the instants when the signals START and STOP have been set.

However, it may be rather complex to stop and/or sample the state STATE of a ring oscillator composed of mere inverter stages.

Figure 5:
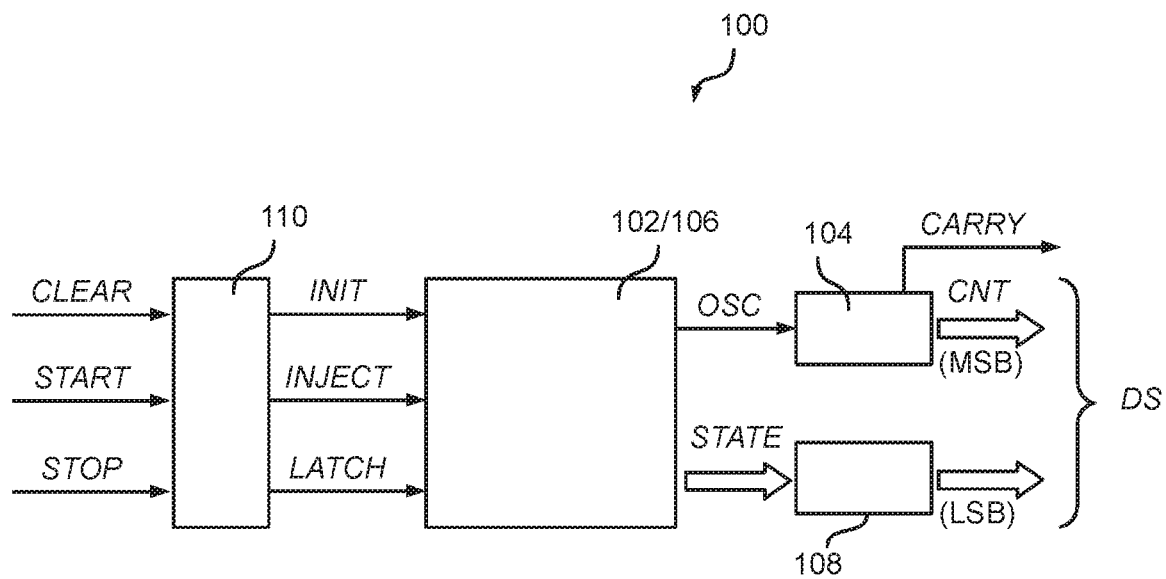
FIG. 5 shows a further embodiment of a time-to-digital converter comprising a ring oscillator.

FIG. 5 shows a second embodiment of time-to-digital converter 100, more or less in line with the disclosure of document U.S. Pat. No. 9,007,133 B2, which is incorporated herein by reference.

Again, the time-to-digital converter bow comprises a ring oscillator 102 comprising a given number N of delay stages 1020 connected in series in order to form a ring/loop. For example, in various embodiments, the ring oscillator 102 may comprise an even number of delay stages, such as 16.

In the embodiment considered, the ring oscillator 102 is driven by a control circuit no as a function of a plurality of control signals. For example, in the embodiment considered, the control circuit 110 is configured to receive at input three signals:

a clear signal CLEAR indicating a reset of the time-to-digital converter 100;

a start signal START indicating the beginning of a time interval; and a stop signal STOP indicating the end of the time interval.

For example, in various embodiments, when the clear signal CLEAR is set, the control circuit 110 may generate a signal INIT for each delay element 1020 for resetting the ring oscillator state STATE. Next, in response to the start signal START, the control circuit 110 may generate a signal INJECT in order to start the ring oscillator 102. Finally, in response to the stop signal STOP, the control circuit 110 may generate a signal LATCH in order to stop the ring oscillator 102.

Thus, in general, during the instant when the signal START is set and the instant when the signal STOP is set, the oscillator 102 will generate a periodic clock signal OSC. The clock signal OSC generated by the oscillator 102 may thus be used to increment a counter 104. Accordingly, at each complete cycle of the ring oscillator 102, the count value CNT of the counter 104 will be increase by one.

Once the ring oscillator 102 has been stopped, the count value CNT of the counter 104 may thus be used as the most significant bits (MSB) of the digital signal DS. For example, in various embodiments, the counter 104 may be a four-bit digital counter, thereby providing four MSB bits. Generally, the counter 104 may also comprise a carry/overflow output, which e.g. may be used to drive an additional counter, thereby permitting to add further MSB bits.

Conversely, the least significant bits (LSB) of the signal DS may be determined as a function of the state signals STATE of the ring oscillator 102. Specifically, in the embodiment considered, the state signals STATE of the various delay elements 1020 are provided to a combinational logic circuit 108, which generates the LSB bits as a function of these state signals STATE. As will be described in greater detail in the following, in various embodiments, no separate sample circuit 106 is used, but the sample circuit 106 is implemented directly within the delay elements 1020. For example, in various embodiments, the ring oscillator 102 comprises 16 delay elements 1022 and the circuit 108 is configured to generate four LSB bits as a function of the 16 state signals STATE of these delay elements 1020.

Figure 6:
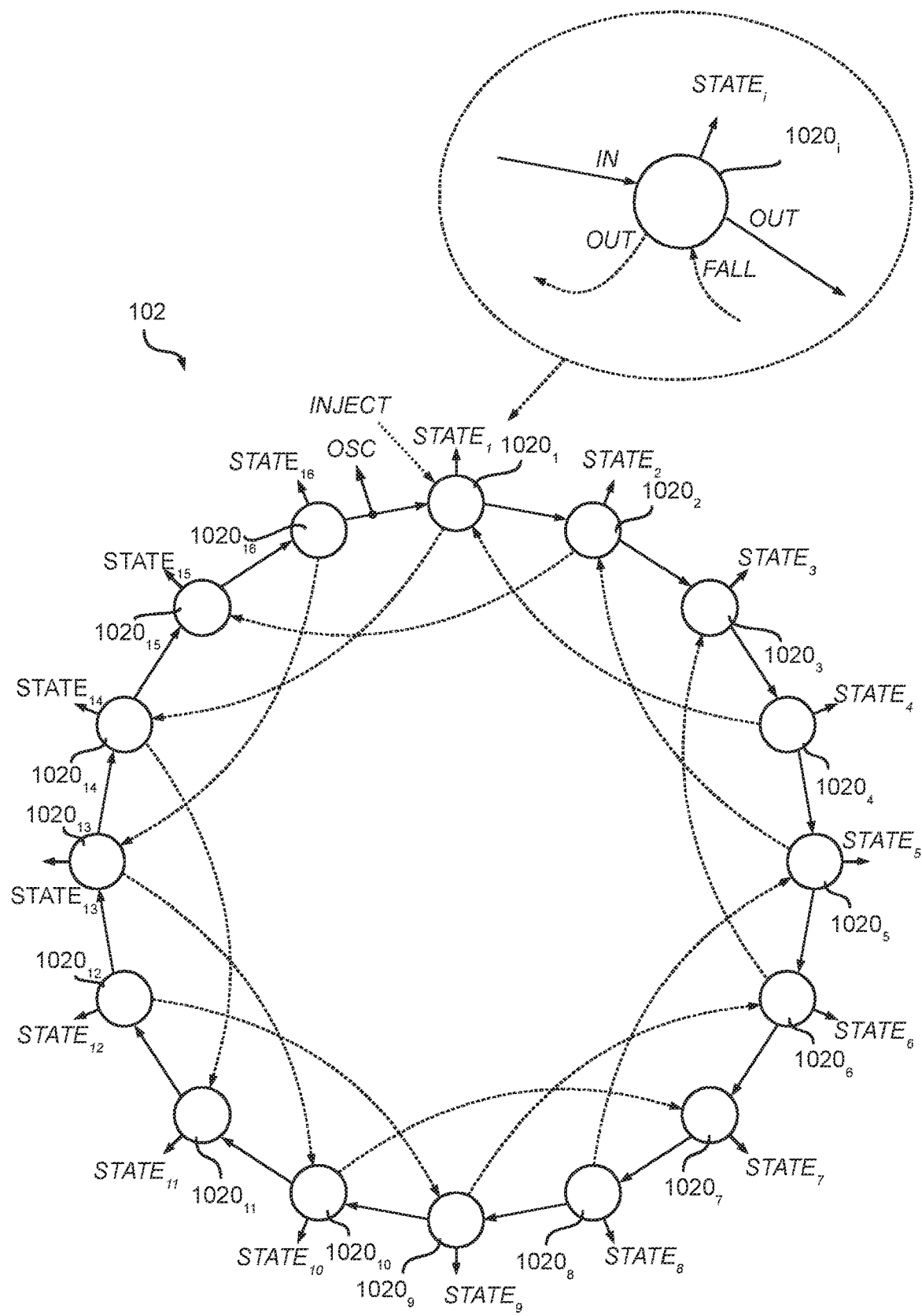
FIG. 6 shows an embodiment of a ring oscillator comprising a plurality of delay stages.

FIG. 6 shows an embodiment of the ring oscillator 102 using a plurality of delay stages 1020.

Specifically, as mentioned before, the ring oscillator 102 comprises a given number N of delay stages 1020, wherein each delay element 1020 comprise an input terminal IN and an output terminal OUT. Specifically, a ring oscillator 102 comprises at least a first, a last and one or more intermediate delay stages 1020. Specifically, the input terminal IN of each intermediate delay element $1020_i$ is connected to the output terminal OUT of the previous/upstream delay element $1020_{i-1}$ and the output terminal OUT of each intermediate delay element $1020_i$ is connected to the input terminal IN of the following/downstream delay element $1020_{i+1}$. Moreover, the input terminal IN of the first delay element $1020_1$ is connected to the output terminal OUT of the last delay element $1020_N$, thereby forming a closed loop. Accordingly, the input terminals IN and output terminals OUT of the delay stages 1020 are connected to form a ring.

In the embodiment considered, each delay stage 1020 is configured to detect a given edge (rising or alternatively falling edge) in the signal at the input IN; and to set the signal at the output OUT to a given first logic level (high or alternatively low) after a given first delay TD1 with respect to the given edge (rising/falling edge) of the signal at the input IN.

Moreover, the ring oscillator 102 is configured such that each delay stage 1020 sets the signal at the output OUT to a given second logic level (opposed to the first logic level) after a given second delay TD2 with respect to the instant when the signal at the output OUT changes to the first logic level.

Thus, essentially, each delay stage 1020 is configured as a pulse generator, which generates a pulse (with the first logic level) having the second duration TD2, wherein the pulse is propagated with the first delay TD1 through the delay stages 1020. Thus, the frequency f of the clock signal OSC generated by the ring oscillator 102, e.g. the signal at the output terminal OUT of the last delay element $1020_N$, corresponds to:

$f=1/(N \times TD1)$

For example, in various embodiments, each delay stage 1020 is configured to set the signal at the output OUT to high after a given first delay TD1 with respect to a rising edge of the signal at the input IN. Conversely, the second duration TD2 is determined by providing a feedback of the signal at the output OUT of a downstream delay stage.

Specifically, in various embodiments, each delay stage 1020 comprises a further input FALL and each delay stage 1020 is configured to set the signal at the output OUT to low when the signal at the input FALL is high, i.e. when the pulse propagated though the delay stages 1020 reaches the output OUT of the respective downstream delay stage 1020. For example, in the embodiment considered are shown 16 delay stages $1020_1 \ldots 1020_{16}$. Moreover, in the embodiment considered, the input terminal FALL of each delay stage $1020_i$ is connected to the output terminal OUT of a following delay stage, such as the delay stage $1020_{i+3}$, e.g. the terminal FALL of the delay stage $1020_1$ is connected to the output terminal OUT of the delay stage $1020_4$.

Thus, the oscillator 102 may be started by temporally setting the signal at the input IN of one of the delay stages 1020 to high. This is schematically shown in FIG. 6, wherein the first delay element $1020_1$ comprises a terminal INJECT for receiving a pulse for starting the ring oscillator 102. Conversely, in various embodiments, the oscillator 102 is be stopped by interrupting the propagation of the pulse through the delay elements via a signal LATCH (not shown in FIG. 6).

Figure 7:
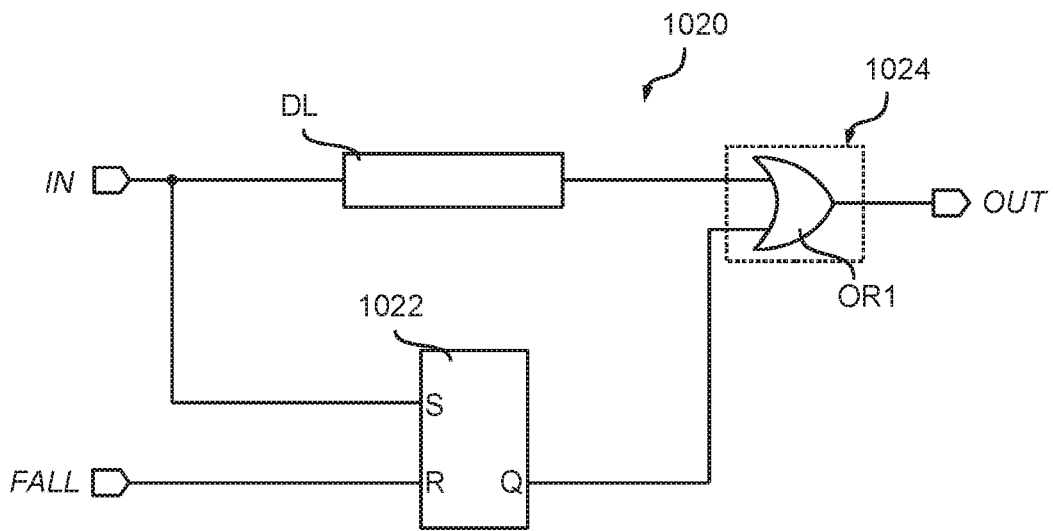
FIGS. 7, 8, 9, 10 and 11 show embodiment of delay stages for the ring oscillator of FIG. 6.

FIG. 7 shows a first embodiment of the delay elements/stages 1020 of the ring oscillator 102.

As mentioned before, in response to a rising edge of the input signal applied to the input terminal IN, the delay elements 1020 sets the output signal at the output terminal OUT after a given first delay TD1 to high. Moreover, after a second delay TD2 the output signal OUT is again set to low. Thus, essentially a pulse with duration TD2 is generated which propagates with a delay TD1 through the various delay stages 1020.

Specifically, in various embodiments, the second duration TD2 is implemented by using the delays TD1 introduced by the delay elements 1020. Specifically, each delay element $1020_i$ comprises a further input FALL, which is connected to the output terminal OUT of a following/downstream delay element $1020_{i+x}$, with x being preferably between 1 and N/2, e.g. 3 or 4. Accordingly, once the pulse propagates to the output of this following delay element $1020_{i+x}$, i.e. once the output terminal OUT of this following delay element $1020_{i+x}$ is set to high, the signal at the input FALL is set to high. Accordingly, the signal at the terminal FALL may be used to set the output terminal of the delay element $1020_i$ to low.

Thus, essentially, each delay element 1020 is configured to:

in response to a rising edge at the terminal IN, set the output terminal OUT to high after a delay TD1; and in response to the signal FALL, set the terminal to low, wherein the signal FALL is set once the pulse arrives at a given following delay element, thereby implementing the delay TD2.

Thus, in various embodiments, the delay stage 1020 may be implemented with a set-reset latch 1022, wherein the set terminal S of the latch 1022 is connected to the terminal IN and the reset terminal R of the latch 1022 is connected to the terminal FALL.

However, the delay introduced by the latch 1022 may be too long. Moreover, the delay can be variable based on the technology process and not uniform for all the delay elements 1020 of the ring oscillator 102.

Thus, in the embodiment shown in FIG. 6, the delay stage 1020 indeed comprises two paths. The first (fast) path implements the delay TD1 between the input terminal IN and the output terminal TD2. Conversely, the second (slow) path is used to maintain the state of the output terminal OUT until the signal at the terminal FALL is set.

Specifically, in the embodiment considered, the input signal at the terminal IN is applied to the input of a delay line DL having the delay TD1. Thus, in response to a rising edge, the output of the delay element 1020 is set to high with a given delay TD1.

However, the input signal at the terminal IN is also applied to a set terminal of the set-reset latch 1022. Accordingly, in response to a rising edge, the output terminal Q of the latch 1022 is set to high. Specifically, in various embodiments, the output terminal Q of the latch 1022 is set with a delay being greater than the delay TD1 of the delay line. Thus, in the embodiment considered, the signal at the output terminal OUT may be obtained by combining at a logic gate 1024 the signal at the output of the delay line DL and the signal at the output terminal Q of the latch 1022.

Generally, in the embodiment considered, the delay stage should implement the following logic equation:

OUT=IN OR Q

Thus, assuming that the delay line DL and the latch 1022 do not perform an inversion of the logic levels, a simple OR gate OR1 may be used for the circuit 1024. Accordingly, the delay TD1 introduced by the delay stage 1020, indeed, corresponds to the sum of the propagation delay of the delay line DL and the propagation delay of the gate 1024. Thus, in the embodiment considered, a rising edge at the terminal IN is propagated with the delay TD1 to the output terminal OUT via the delay line DL and gate 1024, and then the high logic level at the output terminal OUT is maintained via the latch 1022.

Usually, the falling edge at the terminal OUT does not require a precise timing. Thus, in the embodiment considered, the terminal FALL is connected (e.g., directly) to the reset terminal R of the latch 1022. Accordingly, once the signal at the terminal FALL is high, the latch 1022 will be reset and the output terminal Q of the latch 1022 is set to low, thereby resetting the output terminal OUT (assuming that the input terminal IN has been set to low in the meantime).

Figure 8:
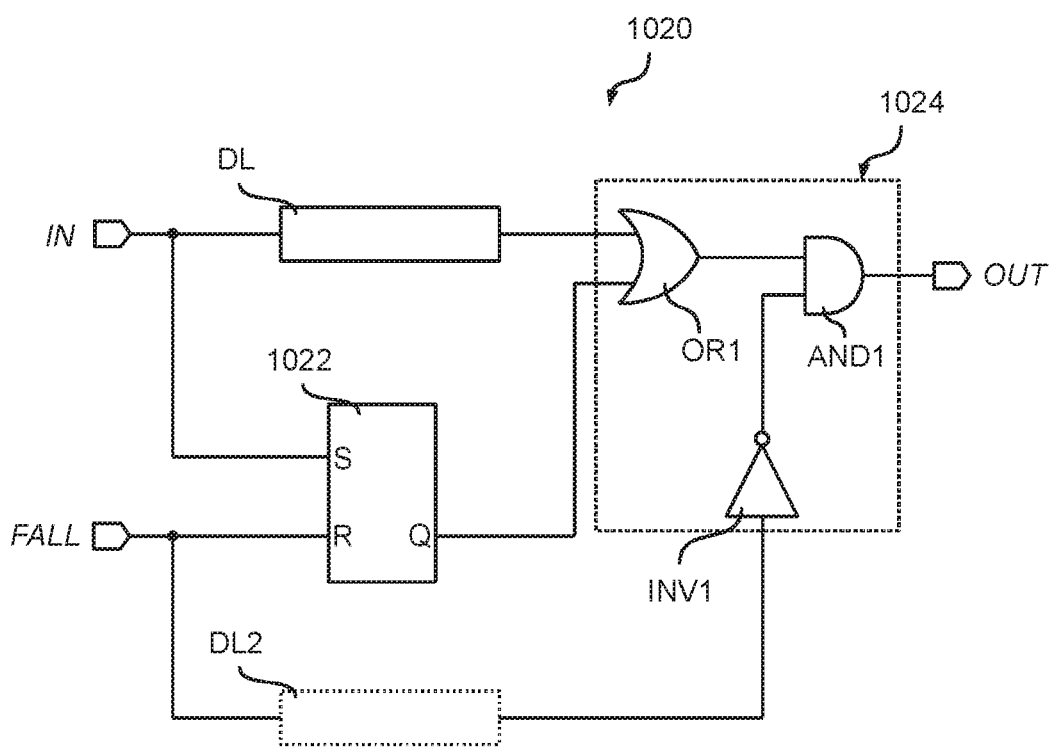

Conversely, FIG. 8 shows an embodiment, wherein also the delay between the terminal FALL and the terminal OUT may be set to a given value and/or the propagation delay between the terminal FALL and the terminal OUT may be reduced.

Specifically, similar to the connection between the terminals IN and OUT, also the path between the terminal FALL and the terminal OUT is split into two paths. The first (fast) path is routed directly to the combinational circuit 1024, while the second (slow) path goes through the latch 1022. Generally, the signal at the terminal FALL may be applied to the combinational circuit 1024 also via an optional delay line DL2.

Moreover, similar to the embodiment shown in FIG. 7, the signal at the terminal FALL is also applied to the reset terminal of the set-reset latch 1022. Accordingly, in response to a rising edge at the terminal FALL, the output terminal Q of the latch 1022 is set to low.

Thus, in the embodiment considered, the signal at the output terminal OUT may be obtained by combining at the logic gate 1024:
 the signal at the output of the delay line DL;
 the signal at the input FALL or the output of the delay line DL2; and
 the signal at the output terminal Q of the latch 1022.

Generally, in the embodiment considered, the delay stage 1020 should implement the following logic equation:

OUT=(IN OR Q) AND NOT(FALL)

Thus, assuming that the delay lines DL and DL2 and the latch 1022 do not perform an inversion of the logic levels, the circuit 1024 may be implemented with an OR gate OR1, an inverter INV1 and an AND gate AND1.

In the embodiments considered, the signal at the output Q of the latch 1022 may thus also be used to identify the state STATE of the respective delay stage 1020. However, as mentioned before, the delay stage 1020 should for this purpose also be able to:
 reset the delay stages in response to the signal INIT;
 start the oscillation in response to the signal INJECT, and
 stop the oscillation in response to the signal LATCH.

Figure 9:
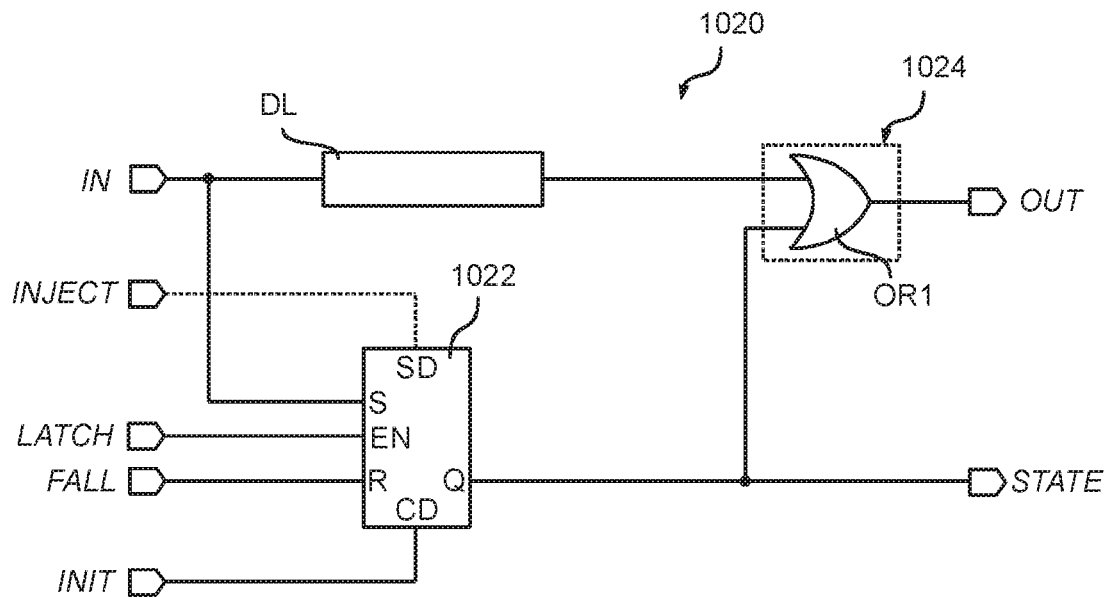

FIG. 9 shows thus a modified delay stage 1020. Specifically, the embodiment is based on the embodiment shown in FIG. 7, but the same modifications may also be performed in the embodiment shown in FIG. 8.

Generally, in the embodiment considered, the signal at the output terminal Q of the latch 1022 is connected (e.g., directly) to an output terminal STATE of the respective delay element 1020, i.e., the switching state of the latch 1022 as indicated by the terminal Q of the latch 1022 identifies the state of the delay stage 1020.

Moreover, in the embodiment considered, the latch 1022 is configured to reset its state, i.e. set the output Q to low, in response to the signal applied to the terminal INIT. For example, this is schematically shown in FIG. 9, wherein the signal at the input INIT is routed/connected to a priority reset terminal CD of the latch 1022. However, the signal INIT could also be routed together with the signal at the terminal FALL via a suitable logic gate to the reset terminal R of the latch 1022. Accordingly, by applying a pulse to the terminals INIT of all delay elements, the state terminal STATE and also the output terminal OUT of each delay elements 1020 is set to low.

Moreover, in the embodiment considered, at least one delay element 1020 (e.g. the first delay element 1020₁) comprises an input terminal INJECT. Specifically, the latch 1022 is configured to set its state, i.e. set the output Q to high, in response to the signal applied to the terminal INJECT. For example, this is schematically shown in FIG. 9, wherein the signal at the input INJECT is routed/connected to a priority set terminal SD of the latch 1022. However, the signal INJECT could also be routed together with the signal at the terminal IN via a suitable logic gate to the set terminal S of the latch 1022. Accordingly, by applying a pulse to the terminals INJECT, the state signal STATE and the output terminal OUT of this delay element 1020 is set to high, thereby generating the rising edged which propagates through the delay elements 1020.

Finally, in the embodiment considered, the delay element 1020 comprises an input terminal LATCH. As mentioned before, the delay stage 1020 should be selectively disabled as a function of the signal at the terminal LATCH. For example, in the embodiment considered, when the signal applied to the terminal LATCH has a first logic level (e.g. low), the latch 1022 is enabled. Conversely, when the signal applied to the terminal LATCH has a second logic level (e.g. high), the latch 1022 is disabled, thus maintaining the state signal STATE. For example, this is schematically shown in FIG. 8, wherein the signal at the input LATCH is routed/connected to an enable terminal EN of the latch 1022.

In various embodiments, the signal LATCH may also be used to stop the pulse propagation within the ring oscillator. For example, this may be obtained by setting the signal at the output terminal OUT of all delay stages to low.

Figure 10:
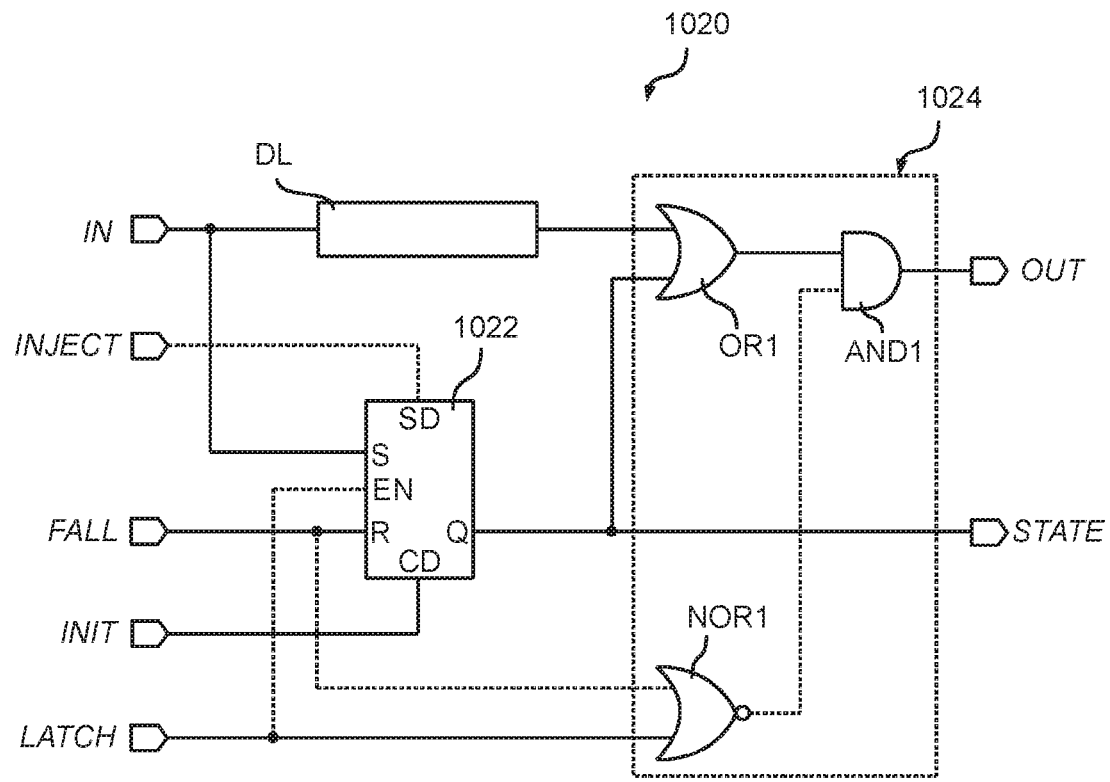

For example, FIG. 10 shows an embodiment wherein also the signal at the terminal LATCH is routed (e.g., directly) to the combinational logic circuit 1024.

For example, in the embodiment considered, also the signal at the terminal FALL is routed to the combinational logic circuit 1024. Accordingly, in the embodiment considered, the delay stage should implement the following logic equation:

OUT=(IN OR Q) AND NOT(FALL OR LATCH)

Thus, assuming that the delay line DL and the latch 1022 do not perform an inversion of the logic levels, the circuit 1024 may be implemented with an OR gate OR1, a NOR gate NOR1 and an AND gate AND1.

Figure 11:
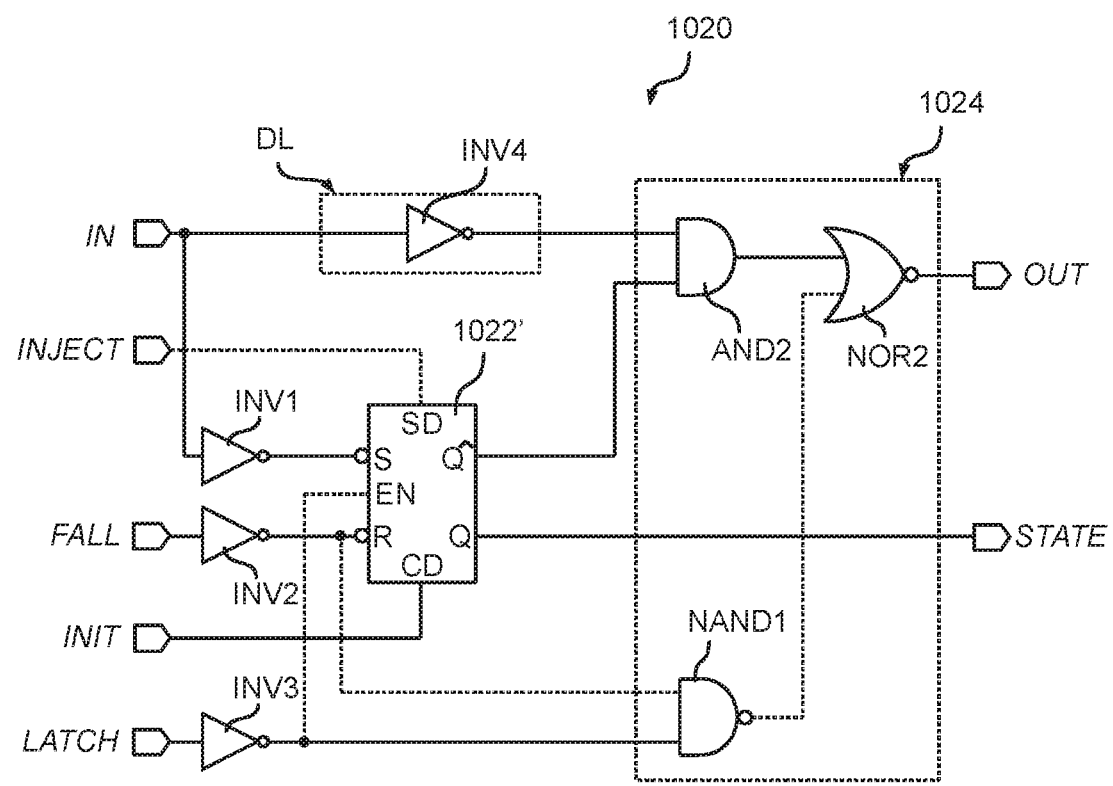

FIG. 11 shows that also other types of set-reset latches may be used.

Specifically, in FIG. 11 is used a latch 1022' which is switched based on falling edges (schematically shown via the circles at the inputs of the latch 1022'), instead of rising edged as in the embodiments described in the foregoing. Accordingly, the output Q of the latch 1022' is set in response to a falling edge at the respective set terminal S and the output Q of the latch 1022' is reset in response to a falling edge at the respective set terminal R.

Accordingly, in this case, the terminal IN may be connected to the set terminal S of the latch 1022' via an inverter INV1 and the terminal FALL may be connected to the reset terminal R of the latch 1022' via an inverter INV2. Substantially, the inverters INV1 and INV2 also operate as filters for glitches in the signals applied to the terminal IN and FALL.

FIG. 11 also shows that a similar inverter INV3 may also be used for the signal at the terminal LATCH, i.e. terminal LATCH is connected to the enable terminal EN of the latch 1022' via an inverter INV3.

Finally, FIG. 10 also shows that the delay line DL may be implemented with one or more inverters INV4 connected in series, thus potentially implementing an inversion of the signal applied to the terminal IN.

Accordingly, in the embodiment considered wherein also the signals at the terminals LATCH and FALL are routed to the combinational circuit 1024 (as in FIG. 9), the delay stage should again implement the following logic equation:

OUT=(IN OR Q) AND NOT(FALL OR LATCH)

For example, in the embodiment considered, the delay stage 1020 indeed implements the following equivalent logic equation:

OUT=[NOT(IN) AND NOT(Q)] NOR [NOT(FALL) NAND NOT(LATCH)]

Specifically, in the embodiment considered, the operations NOT(IN), NOT(FALL) and NOT(LATCH) are implemented already with the inverters INV2, INV3 and INV4, respectively. Conversely, the operation NOT(Q) may be implemented by using the inverting output Q^ of the latch 1022' or alternatively an additional inverter. Thus, in the embodiment considered, the circuit 1024 may be implemented with an AND gate AND2, a NAND gate NAND1 and a NOR gate NOR2.

Accordingly, in the embodiment considered (see also FIG. 5), the ring oscillator 102 operates with three input signals: the signal INIT applied to each delay elements 1020 for resetting the ring oscillator 102; the signal INJECT applied to one of the delay elements 1020 for starting the ring oscillator, thereby generating the clock signal OSC; and the signal LATCH applied the delay elements 1020 for stopping the ring oscillator 102, thereby permitting a sampling of the state of the delay elements 1020 of the ring oscillator.

Accordingly, in various embodiments, the control circuit 110 shown in FIG. 5 may be configured to generate these signals as a function of a clear signal CLEAR, a start signal START and a stop signal STOP. Generally, the control circuit 110 is purely optional, because the TDC 100 could also receive directly the control signals for the ring oscillator 102.

For example, once the start signal START is set, the control circuit 110 may set the signal INJECT, whereby the time count is enabled by the ring oscillator 102 swinging/oscillating. Specifically, the oscillation is injected into the ring oscillator 102 by setting high the input INJECT of one of the delay elements 1020.

Specifically, in various embodiments, each delay element 1020 comprises the input INJECT and the index of terminal INJECT to be used is selectable, e.g. through a 4-bit digital word for the exemplary ring oscillator with N=16 delay stages 1020. The use of this plurality of terminals INJECT will be described in greater detail in the following.

The pulse waves propagate through the ring oscillator 102 returning back to the starting delay element 1020. After a complete round (essentially having a duration of N×TD1) the clock signal OSC goes high. The count of rising edges of the clock signal OSC are counted by the counter 104 and provide the MSB part (e.g. 4 bit) of the total time count DS. When the stop signal STOP is set, the control circuit 110 sets the signal LATCH to interrupt the oscillation and "freeze" the states of the delay elements 1020, thereby permitting a sampling of the state signals STATE of the delay stages 1020.

Figure 12:
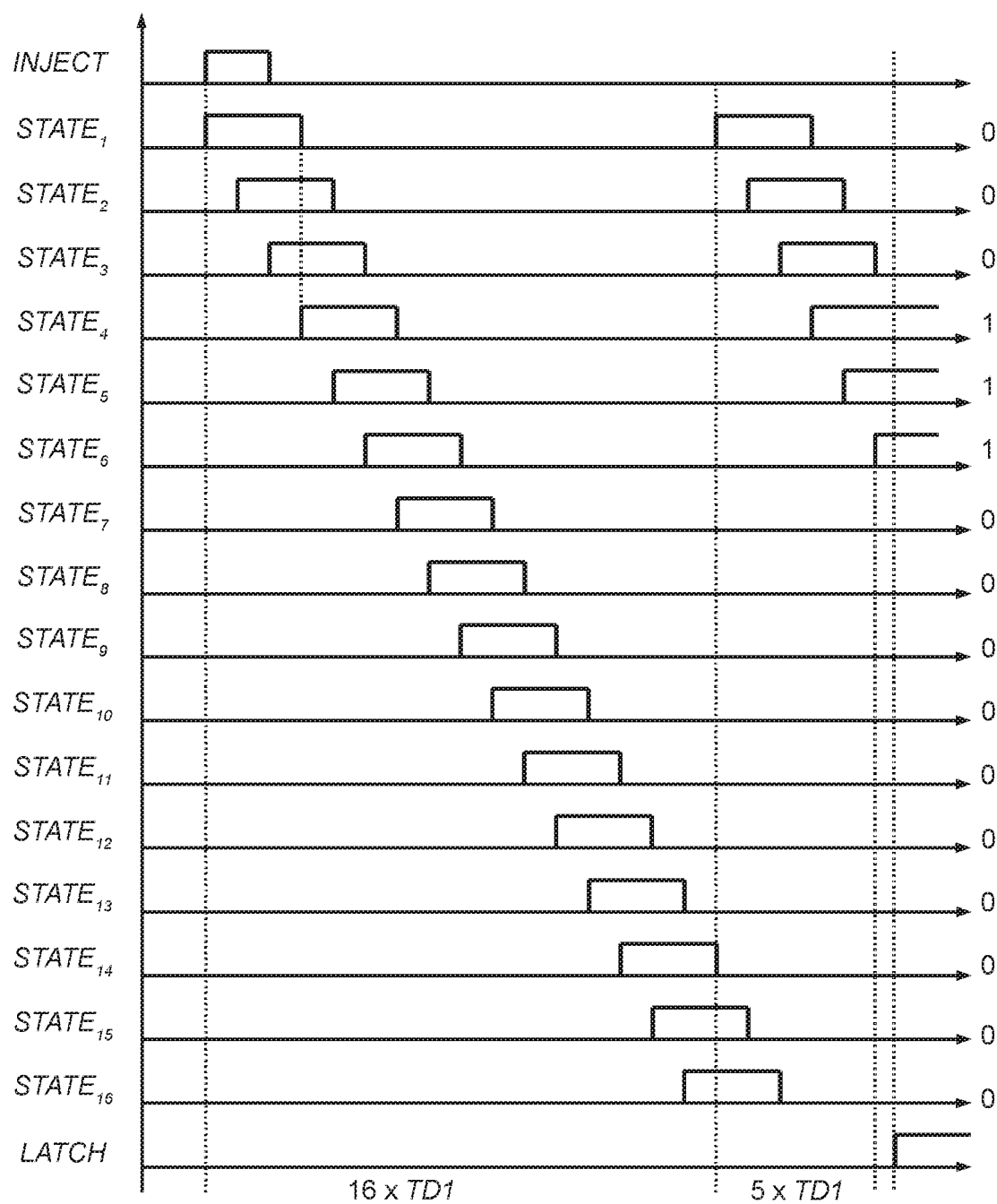
FIG. 12 shows exemplary waveform for the ring oscillator of FIG. 6.

FIG. 12 shows an example of the behavior of the delay element states $STATE_1 \ldots STATE_{16}$ in response to a signal INJECT and a signal LATCH.

Specifically, once the signal LATCH is set and the state is maintained stable, the circuit 108 may convert the state signals STATE to the LSB fractional time count. For example, in the embodiment considered, the conversion may be performed within the circuit 108 by searching the two consecutive delay elements 1020 whose states achieve a high-to-low transition (1 to 0), i.e. the delay elements $2010_6$ and $1020_7$ providing the state signals STATE6 and STATE7 in FIG. 12.

For example, in the example considered, the four LSB may be "0101" meaning that the ring oscillator wave has been stopped at the sixth delay element $1020_6$ from the first delay element $1020_1$, obtaining a fractional time count of five delays TD1. Moreover, in the example the count value of the counter 104 has been increase by one, i.e. the count value may be "0001" (corresponding to additional 16 delays TD1 in the exemplary embodiment). Accordingly, the value of the signal DS may be "00010101" showing a total time count of 21 TD1.

In various embodiments, in order to tune the time delay TD1 of the delay line DL of each delay element 1020, a dedicated trimming circuit may be embedded in each delay element 1020. For example, such a trimming may be obtained by adjusting the supply signals of one or more inverters (see also FIG. 11) within the delay line DL.

Figure 13:
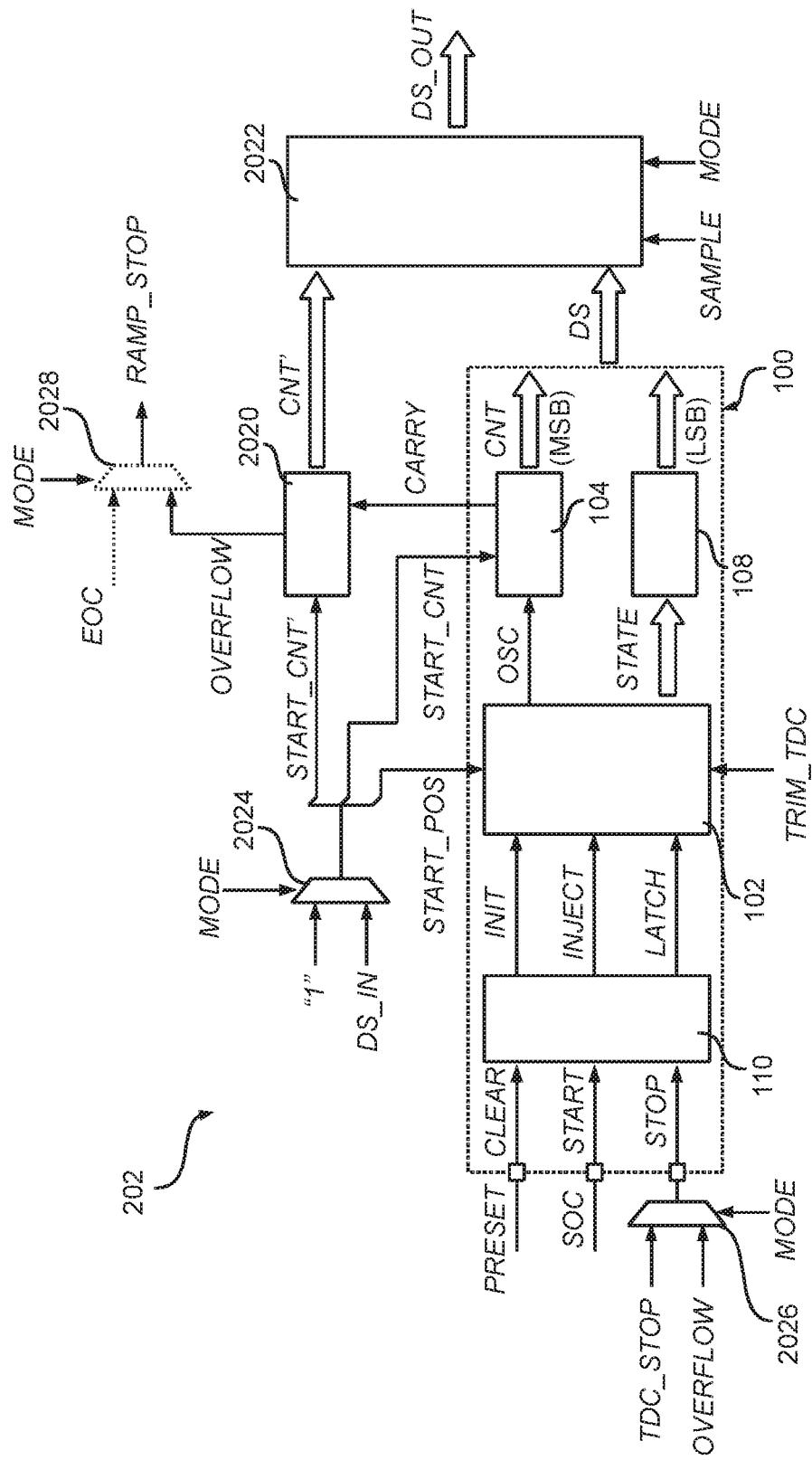
FIG. 13 shows an embodiment of a timer circuit of FIG. 2.

FIG. 13 shows an embodiment of a complete time-to-digital and digital-to-time conversion circuit 202, which is essentially based on the TDC 100 described with respect to FIGS. 5 to 12.

Specifically, in the embodiment considered, the TDC 100 comprise again input terminals for controlling the time measurement operation of the TDC 100, in particular for receiving at least the following signals: a clear signal CLEAR used to initialize the TDC 100; a start signal START for starting the time measurement; and a stop signal STOP for stopping the time measurement.

In the timer circuit 100 described with respect to FIGS. 5 to 12, all latches 1022 are reset and the oscillation is started by applying a pulse to the terminal INJECT of the first delay stage 1020$_1$. Conversely, in the embodiment considered, the timer circuit 100 comprises also input terminals for receiving a start state of the timer circuit. Specifically, in various embodiments, the start state includes both the position index START_POS of the delay stage 1020 at which the oscillation should be started and the initial count value START_CNT for the counter 104.

Specifically, in response to the clear signal CLEAR, the control circuit 110 of the timer circuit 100 is configured to generate again the signal INIT for resetting the latches 1022 of the delay elements 1020, thereby setting the output terminals OUT of the delay elements 1020 to low. However, instead of simply resetting the counter 104 to zero, the count value of the counter 104 is set to the value START_CNT.

Moreover, once the start signal START is set, the control circuit 110 of the timer circuit 100 generates again the signal INJECT in order to start the oscillator 102. However, instead of applying the signal INJECT always to the first delay stage 1020$_1$, the control circuit 110 of the timer circuit 100 is configured to apply the signal INJECT to the respective terminal of the delay element 1020 indicated by the position data START_POS.

Accordingly, in the embodiment considered, the oscillation of the oscillator 102 is started at the delay stage indicated by the position data START_POS and the counter 104 is increased from the initial value START_CNT.

For example, again assuming a ring oscillator 102 with 16 delay elements 1020 and a counter 104 with four bits, the start state may consist in 8 bits, wherein the (e.g. 4) LSB correspond to the signal START_POS used to set the start delay element 1020 (for the signal INJECT) and the (e.g., 4) MSB are used as start value START_CNT for the counter 104.

Accordingly, once the stop signal STOP is set, the control circuit 110 is configured to generate the signal LATCH, which stops the oscillator 102 and permits a reading of the data DS of the timer circuit 100, i.e., the value of the counter 104 and the state signal STATE, which is decoded by the circuit 108.

In the embodiment considered is shown also an additional further counter 2020, which is incremented in response to the carry signal CARRY provided by the counter 104 of the timer circuit 100. For example, in the embodiment considered, the timer circuit 100 provides a given number of bits (e.g., 4) determined by the circuit 108 as a function of the state STATE of the ring oscillator 102, representing the bits with the highest resolution. Moreover, the TDC 100 provides a given number of bits (e.g., 4) corresponding to the bits of the counter 104, representing the bits with a lower resolution compared to the bits provided by the circuit 108. Finally, the counter 2020 may be used to provide a further number of bits, representing the bits with a lowest resolution compared to the bits provided by the TDC 100. Generally, the counter 2020 may also be combined with the counter 104, i.e. a counter 104 with a greater number of bits could be used.

Thus, similar to the counter 104, also the counter 2020 may receive a start value START_CNT' during the initialization of the circuit. In the embodiment considered, the time-to-digital and digital-to-time conversion circuit 202 comprise also an optional register 2022 for storing the data DS provided by the TDC 100 and the count value CNT' provided by the optional counter 2020. Specifically, in the embodiment considered, the signal DS_OUT at the output of the register 2022 comprises:

as MSB the data CNT' provided by the counter 2020;
as intermediate bits the data CNT provided by the counter 104; and
a LSB the data provided by the circuit 2022.

Thus, the TDC 100 essentially implements a high-resolution timer circuit which starts counting form a given reset value (as indicated by the data START_POS, START_CNT and START_CNT').

As described in the foregoing, the circuit 100 should be operated either as a time-to-digital converter or as a digital-to-time converter. Specifically, as described with respect to FIG. 2, when the circuit 200 is operated as ADC, the circuit 204 compares the ramp signal(s) with the voltage $V_{IN}$ and generates a timer stop signal TDC_STOP after a time duration, which is proportional to the input voltage $V_{IN}$. Accordingly, in this case, the timer circuit 202 should be started together with the ramp generator 204 and the ring oscillator 102 should be stopped once the timer stop signal TDC_STOP is set. Next, the conversion circuit 200 may sample the signal DS provided by the oscillator 102 and optionally the additional bits provided by the counter 2020, which are thus indicative of the time duration.

Conversely, when the circuit 200 is operated as DAC, the circuit 202 should generate the ramp stop signal RAMP_STOP after a time duration, which is proportional to the digital input signal DS_IN. In turn the ramp generator varies the ramp signal(s) until the TDC 202 signals that a given time has lapsed.

For example, in order to generate the ramp stop signal RAMP_STOP after a time duration, which is proportional to the digital input signal DS_IN, the timer circuit 202 may initialize the timer circuit 100 (and the counter 2020) via the signals START_POS and ART_CNT (and START_CNT') to a given initial value; and wait that the counter 104 (or the counter 2020) reaches a given reference value.

For example, in various embodiment, the TDC 100 and the optional counter 2020 are initialized to respective values and the ramp stop signal RAMP_STOP corresponds to the overflow/carry signal CARRY of the counter 104 or, when used, the overflow/carry signal OVERFLOW of the counter 2020.

Accordingly, the TDC 100 or the modified TDC (comprising also the counter 2020) should change its configuration as a function of the mode signal MODE.

Generally, the clear signal CLEAR of the control circuit 110 may correspond to the previously described signal PRESET used to initialize the ramp generator 204, i.e. the TDC 100 or the modified TDC is reset in response to the signal PRESET, thereby loading the initialization data for the counter(s) (START_CNT and START_CNT) and setting the start position for the oscillator 102 (START_POS).

Specifically, in various embodiments, when the mode signal MODE indicates an A/D conversion, the initial state data should correspond to 1, i.e. the first delay element 1020 should receive the signal INJECT, while the counter 104 and the optional counter 2020 are reset to 0. Conversely, when the mode signal MODE indicates a D/A conversion, the initial state data should correspond to the digital input data DS_IN. For example, in the embodiment considered, a multiplexer 2024 is used for this purpose, which generates the initial state data by selecting either a bit sequence corresponding to "1" or the signal DS_IN as a function of the mode signal MODE.

Generally, the start signal START of the control circuit 110 may correspond to the previously described start-of-conversion signal SOC, i.e. the oscillator 102 or the modified TDC is started together with the ramp generator 204 in response to the signal SOC.

However, as mentioned before the oscillator 102 should be stopped:

when the mode signal MODE indicates an A/D conversion, in response to the timer stop signal TDC_STOP provided by the ramp generator 204; or when the mode signal MODE indicates a D/A conversion, once the counter 104/2020 reaches a given reference value, e.g. in response to the overflow signal OVERFLOW of the counter 2020.

For example, in the embodiment considered, a multiplexer 2026 is used for this purpose, which generates the stop signal STOP for the control circuit 110 by selecting either the signal TDC_STOP or the signal OVERFLOW as a function of the mode signal MODE.

Accordingly, in response to the signal STOP, the control circuit 110 will generate the signal LATCH in order to stop the oscillator 102.

Finally, at least when the mode signal MODE indicates a D/A conversion, the timer circuit 202 should generate the signal RAMP_STOP once the counters 104/2020 reaches the given reference value, e.g. in response to the overflow signal OVERFLOW of the counter 2020.

Conversely, when the mode signal MODE indicates an A/D conversion, the ramp stop signal RAMP_STOP may be set once the conversion has been completed. For example, in FIG. 12 is schematically shown a multiplexer 2028, which generates the ramp stop signal RAMP_STOP by selecting either the signal OVERFLOW or an end-of-conversion signal EOC, which may be set, e.g., by the control circuit 110 once the oscillator 102 has been stopped.

Conversely, at least when the mode signal MODE indicates a A/D conversion, the output register 2022 should sample the data signal DS (provided by the circuits 104 and 108) and the value of the optional counter 2020. For example, in various embodiments, a separate sample signal SAMPLE is used for this purpose, i.e. the register 2022 stored the data signal DS and optionally the value of the counter 2020 in response to a signal SAMPLE.

Figure 14:
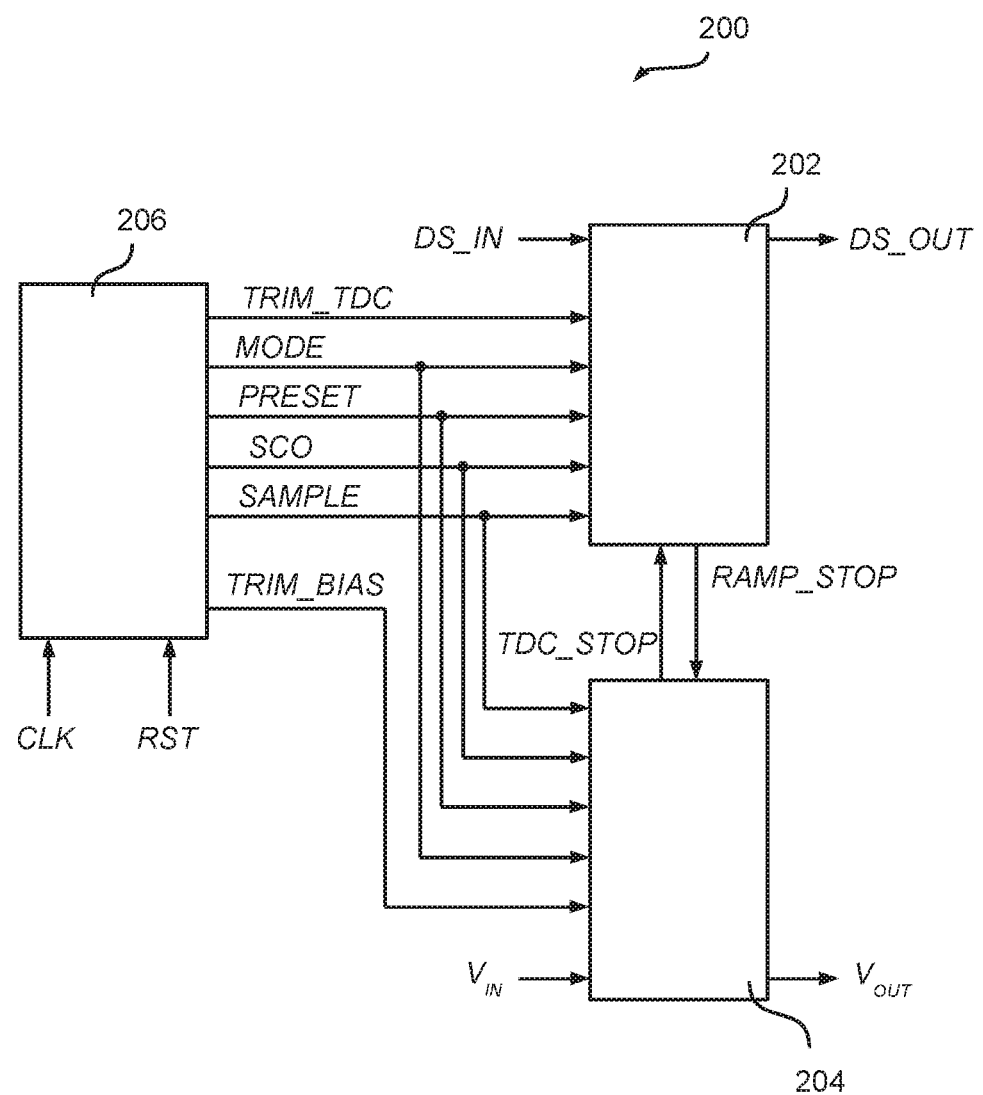
FIG. 14 shows a further embodiment of an A/D and D/A conversion circuit.

FIG. 14 shows an embodiment of the complete converter circuit 200 implementing both an analog-to-digital converter and a digital-to-analog converter.

Specifically, in the embodiment considered, the control circuit 206 is configured to generate the mode control signal MODE, which is used to select either the ADC mode (e.g. MODE="0") or the DAC mode (e.g. MODE="1").

In the embodiment considered, the control circuit 206 also generates the preset signal PRESET, which is used to initialize the time-to-digital conversion circuit 202 and the ramp generator 204.

In the embodiment considered, the control circuit 206 generates also a start-of-conversion signal SOC, which signals to the time-to-digital and digital-to-time conversion circuit 202 and the ramp generator 204 that a new conversion (as specified by the mode signal MODE) should be started.

Finally, the control circuit 206 generates the sample signal SAMPLE. Specifically, in the embodiment considered, the signal SAMPLE is used to enable the $V_{OUT}$ sampling (DAC mode) or store the signal DS_OUT (ADC mode).

Thus, in general, the converter circuit 200 is configured to selectively convert an analog input voltage $V_{IN}$ into a digital output signal DS_OUT or a digital input signal DS_IN into an analog output voltage $V_{OUT}$ as a function of a mode signal MODE indicating a digital-to-analog conversion or an analog-to-digital conversion, respectively. The converter circuit 200 comprises a timer circuit 202, a ramp generator 204 and a control circuit 206, wherein the control circuit 206 is configured to generate (at least) a start-of-conversion signal SOC.

Specifically, in various embodiments, the ramp generator 204 is configured to monitor the start-of-conversion signal SOC. Once the start-of-conversion signal SOC is set and when the mode signal MODE indicates an analog-to-digital conversion, the ramp generator 204 generate by means of a variation of at least one ramp signal $V_{2046}$ and/or $V_{2048}$ and the comparator 2042 the timer stop signal TDC_STOP after a time interval determined as a function of the value of the analog input voltage $V_{IN}$, thereby implementing an analog-to-time conversion.

Conversely, once the start-of-conversion signal SOC is set and when the mode signal MODE indicates a digital-to-analog conversion, the ramp generator 204 varies the at least one ramp signal $V_{2046}$ and/or $V_{2048}$ until the ramp stop signal RAMP_STOP is set and, in response to the ramp stop signal RAMP_STOP, determines the analog output voltage $V_{OUT}$ as a function of the at least one ramp signal $V_{2046}$ and/or $V_{2048}$, thereby implementing a time-to-analog conversion.

In various embodiments, the timer circuit 202 is configured to monitor the start-of-conversion signal SOC. Once the start-of-conversion signal SOC is set and when the mode signal MODE indicates an analog-to-digital conversion, the timer circuit 202 varies at least one count value CNT/CNT' until the timer stop signal TDC_STOP is set and, in response to the timer stop signal TDC_STOP, determines the digital output signal DS_OUT (at least) as a function of the at least one count value CNT/CNT', thereby implementing a time-to-digital conversion.

Conversely, once the start-of-conversion signal SOC is set and when the mode signal MODE indicates a digital-to-analog conversion, the timer circuit 202 generates by means of a variation of the at least one count value CNT/CNT' the ramp stop signal RAMP_STOP after a time interval determined as a function of the value of the digital input signal DS_IN, thereby implementing a digital-to-time conversion.

Specifically, in various embodiments, the timer circuit 202 comprises for this purpose at least one counter 104/2020 providing the at least one count value CNT/CNT' and a ring oscillator 102.

Specifically, in various embodiments, the ring oscillator 102 comprising a first delay stage $1020_1$, a plurality of intermediate delay stages $1020_i$ and a last delay stage $1020_N$. In various embodiments, each delay stage 1020 comprises an input terminal IN and an output terminal OUT, wherein the input terminal IN of each intermediate delay stage $1020_i$ is connected to the output terminal OUT of an upstream delay stage 1020, the output terminal OUT of each intermediate delay stage $1020_i$ is connected to the input terminal IN of a downstream delay stage 1020 and the output terminal OUT of the last delay stage $1020_N$ is connected to the input terminal IN of the first delay stage $1020_1$, wherein the signal at the output terminal OUT of the last delay stage $1020_N$ corresponds to a clock signal OSC used to increase the at least one counter 104/2020.

In various embodiments, each delay stage 1020 comprises a set-reset latch 1022 having a set terminal S, a reset terminal R and an output terminal Q, wherein the set terminal S of the latch 1022 is connected to the input terminal IN of the respective delay stage 1020, the reset terminal R of the latch 1022 is connected (via the terminal FALL) to the output terminal OUT of a downstream delay stage 1020 and the output terminal Q of the latch 1022 is connected to the output terminal OUT of the respective delay stage 1020.

Accordingly, in various embodiments, in order to implement the above-mentioned time-to-digital conversion, i.e. when the mode signal MODE indicates an analog-to-digital conversion, the timer circuit 202 is configured to:

reset (via the signal INIT) the latches 1022 of the delay stages 1020 and reset the at least one count value CNT/CNT' of the at least one counter 104/2020, in response to the start-of-conversion signal SOC, start the ring oscillator 102 by setting the latch 1022 of the first delay stage 1020₁, in response to the timer stop signal TDC_STOP, stop the ring oscillator 102, and determine the digital output signal DS_OUT as a function of the at least one count value CNT/CNT' provided by the at least one counter 104/2020 and the signals STATE at the output terminals Q of the latches 1022.

Conversely, in various embodiments, in order to implement the above-mentioned digital-to-time conversion, i.e. when the mode signal MODE indicates a digital-to-analog conversion, the timer circuit 202 is configured to:

reset (via the signal INIT) the latches 1022 of the delay stages 1020 and set the at least one count value CNT/CNT' of the at least one counter 104/2020) to a respective value (START_CNT, START_CNT) determined as a function of the digital input signal DS_IN, in response to the start-of-conversion signal SOC, start the ring oscillator 102 by setting the latch 1022 of a delay stage 1020 selected (via the signal START_POS) amongst the delay stages 1020 as a function of the digital input signal DS_IN, compare the at least one count value CNT/CNT' of the at least one counter 104/2020 with a reference value, e.g. by using the carry signal CARRY and/or the overflow signal OVERFLOW, and in response to the comparison, generate the ramp stop signal RAMP_STOP when the at least one count value CNT/CNT' of the at least one counter 104/2020 reaches the reference value.

In various embodiment, the digital control block 206 may also provide the calibration data TRIM_TDC to the time-to-digital conversion circuit 202 and/or calibration data TRIM_BIAS to the ramp generator 204, such as the previously mentioned calibration data for the delay element 1020, e.g. for implementing a manual or automatic converter calibration. In fact, similar to the calibration of the delay lines DL of the timer 202, also the gradient of the ramps of the ramp generator 204 may be configurable.

For example, in various embodiments the current provided by the current sources 2050 and/or 2052 shown in FIG. 3 may be set as a function of the signal TRIM_BIAS provided by the control circuit 206.

Generally, the calibration may be performed manually or automatically. For example, the calibration may be performed by varying the signal TRIM_TDC and/or TRIM_BIAS in order to synchronize the operation of the timer 202 with the ramp generator 204.

A possible calibration operation is shown in FIG. 15.

Specifically, in the embodiment considered, a D/A conversion of the minimum digital input value DS_IN (e.g. "1") is performed, which should result in a minimum output voltage $V_{OUT}$, e.g. $V_{OUT}=0$ V. As mentioned before, when performing a D/A conversion, the control circuit 206 generates at an instant $t_0$ the signal PRESET, and (in response to this signal) the state of the timer circuit 100 is initialized to the value of the digital input signal DS_IN, e.g. "1". Conversely, the voltage difference of the voltages $V_{2046}$ and $V_{2048}$ at the nodes 2046 and 2048 of the ramp generator 204 (see FIG. 3) is set to a given reference voltage, e.g. VDD via the switches S0 and S1.

Thus, when the control circuit 206 sets the start-of-conversion signal SOC at an instant $t_1$, the ring oscillator 102 is started at the first delay stage 1020₁ and contemporaneously is stated the ramp generation, i.e. the voltage $V_{2046}$ at the node 2046 decreases and the voltage $V_{2048}$ at the node 2048 increase.

Generally, when the counter 104/2020 reaches the reference value, e.g. when the overflow bit OVERFLOW is set, the ramp stop signal RAMP_STOP is generated at an instant $t_3$.

In parallel the comparator 2042 of the ramp generator 204 monitors the voltage difference between the nodes 2046 and 2048 and generates the signal COMP at an instant $t_2$ when the voltage difference between the nodes 2046 and 2048 is approximately 0 V.

Specifically, as shown in FIG. 15*a*, when the bocks 202 and 204 are synchronized, the ramp-stop signal RAMP_STOP should be generated when the voltage difference between the nodes 2046 and 2048 is approximately 0 V.

Thus, the control circuit 206 may monitor also the signal COMP at the output of the comparator 2042 or the timer-stop signal TDC_STOP in order to determine when the voltage difference between the nodes 2046 and 2048 indeed has reached 0 V and determine whether this instant $t_2$ corresponds to the instant $t_3$ when the ramp stop signal RAMP_STOP is generated. Generally, the control circuit 206 may also monitor the time difference between these instants and accept a time range.

Conversely, as shown in FIG. 15*b*, when the gradient of the ramp generator is too high and/or the delay TD1 is too high, the output COMP of the comparator 2042 will be set to high at the instant $t_2$ before the timer-stop signal TDC_STOP is set at the instant $t_3$. Conversely, when the gradient of the ramp generator is too small and/or the delay TD1 is too small, the output COMP of the comparator 2042 will be set to high at an instant $t'_2$ after the timer-stop signal TDC_STOP is set at the instant $t_3$. Accordingly, the control circuit 206 may adjust the signals TRIM_TDC and/or TRIM_BIAS until the generation of the timer-stop signal TDC_STOP and the ramp stop signal RAMP_STOP correspond. Generally, as mentioned before, the control circuit 206 may also monitor the time difference between these instants and accept a time range.

Essentially, the operation described in the foregoing corresponds also to an A/D conversion of the maximum possible input voltage $V_{IN}=VDD$, insofar as the timer stop signal TDC_STOP and the ramp stop signal RAMP_STOP are generated in this case in the same way.

Figure 16:
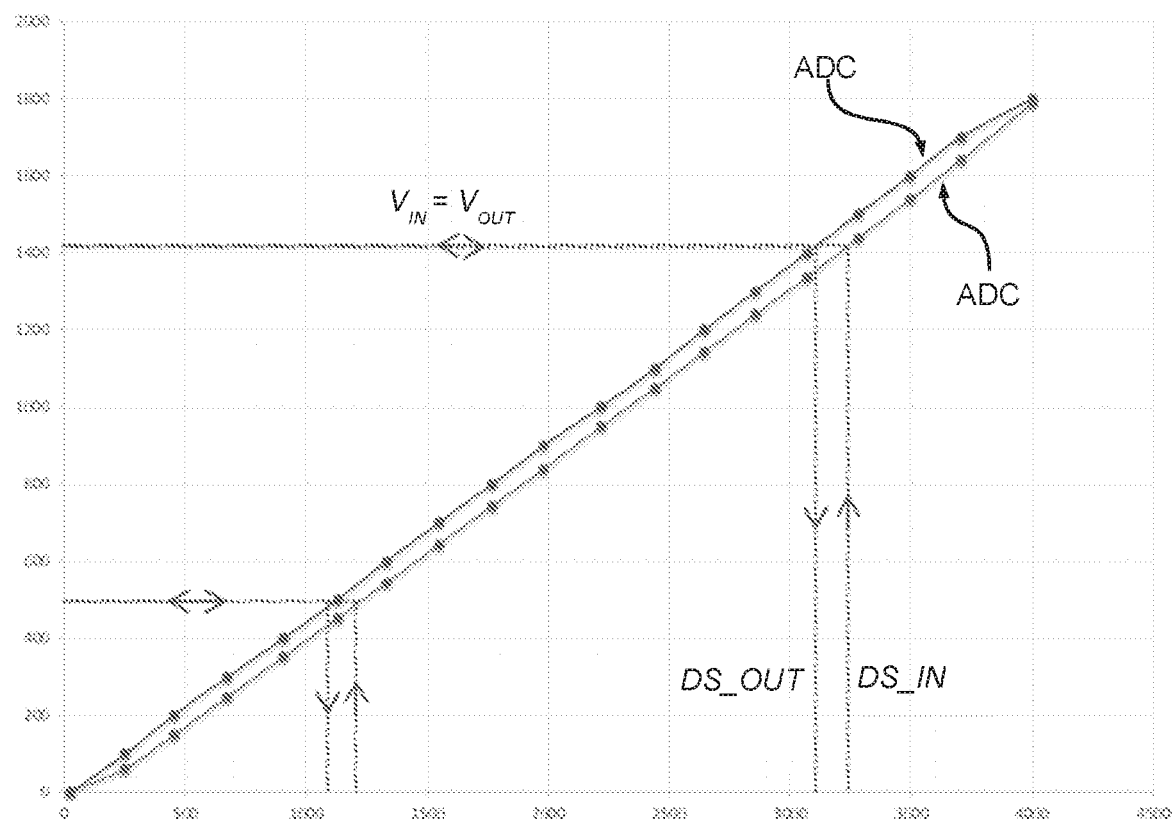
FIG. 16 shows a further embodiment of calibration methods for the conversion circuit of FIG. 14.

FIG. 16 shows a further calibration method, which may be used to perform a precise calibration.

Specifically, in the embodiment considered, the conversion circuit 200 is first used to perform a D/A conversion for a given digital input value DS_IN. Next, the obtained output voltage $V_{OUT}$ is used as input voltage $V_{IN}$ for an A/D conversion and the obtained digital value DS_OUT is compared with the initial digital input value DS_IN.

Thus, by mapping the behavior of the values DS_IN and DS_OUT the behavior of the converter 200 may be cali-

What is claimed is:

1. A converter circuit configured to selectively convert an analog input voltage into a digital output signal or a digital input signal into an analog output voltage as a function of a mode signal, wherein the converter circuit comprises:
   a control circuit configured to generate a start-of-conversion signal;
   a ramp generator configured to:
      monitor the start-of-conversion signal;
      when the start-of-conversion signal is set and the mode signal indicates an analog-to-digital conversion, generate a timer stop signal after a time interval that is determined as a function of a value of the analog input voltage, thereby implementing an analog-to-time conversion, the timer stop signal being generated by variation of a ramp signal applied to a comparator; and
      when the start-of-conversion signal is set and the mode signal indicates a digital-to-analog conversion, vary the ramp signal until a ramp stop signal is set and, in response to the ramp stop signal, determine the analog output voltage as a function of the ramp signal, thereby implementing a time-to-analog conversion;
   a timer circuit comprising a counter configured to provide a count value and a ring oscillator comprising a first delay stage, a plurality of intermediate delay stages and a last delay stage, the timer circuit configured to:
      monitor the start-of-conversion signal;
      when the start-of-conversion signal is set and the mode signal indicates an analog-to-digital conversion, vary the count value until the timer stop signal is set and, in response to the timer stop signal, determine the digital output signal as a function of the count value, thereby implementing a time-to-digital conversion; and
      when the start-of-conversion signal is set and the mode signal indicates a digital-to-analog conversion, generate the ramp stop signal after a time interval determined as a function of a value of the digital input signal, thereby implementing a digital-to-time conversion, the ramp stop signal generated by a variation of the count value.

2. The converter circuit according to claim 1, wherein each delay stage of the ring oscillator comprises:
   an input terminal and an output terminal, wherein the input terminal of each intermediate delay stage is connected to the output terminal of an upstream delay stage, the output terminal of each intermediate delay stage is connected to the input terminal of a downstream delay stage and the output terminal of the last delay stage is connected to the input terminal of the first delay stage, wherein the signal at the output terminal of the last delay stage corresponds to a clock signal used to increase the counter; and
   a set-reset latch having a set terminal, a reset terminal and an output terminal, wherein the set terminal of the set-reset latch is connected to the input terminal of the respective delay stage, the reset terminal of the set-reset latch is connected to the output terminal of a downstream delay stage and the output terminal of the set-reset latch is connected to the output terminal of the respective delay stage.

3. The converter circuit according to claim 2, wherein, when the mode signal indicates an analog-to-digital conversion, the timer circuit is configured to:
   reset the set-reset latches of the delay stages of the ring oscillator and reset the count value of the counter;
   in response to the start-of-conversion signal, start the ring oscillator by setting the set-reset latch of the first delay stage;
   stop the ring oscillator in response to the timer stop signal; and
   determine the digital output signal as a function of the count value provided by the counter and the signals at the output terminals of the set-reset latches of the delay stages of the ring oscillator.

4. The converter circuit according to claim 3, wherein the timer circuit is configured to determine the digital output signal as a function of the count value provided by the counter and the signals at the output terminals of the set-reset latches of the delay stages of the ring oscillator by:
   determining the least significant bits of the digital output signal as a function of the signals at the output terminals of the set-reset latches of delay stages of the ring oscillator; and
   determining the most significant bits of the digital output signal as a function of the count value provided by the counter.

5. The converter circuit according to claim 4, wherein determining the least significant bits of the digital output signal comprises searching two consecutive delay stages of the ring oscillator, wherein the signal at the output terminal of a respective first delay stage is high and the signal at the output terminal of a respective consecutive second delay stage is low.

6. The converter circuit according to claim 4, wherein determining the most significant bits of the digital output signal comprises setting the most significant bits of the digital output signal to the count value provided by the counter.

7. The converter circuit according to claim 2, when, the mode signal indicates a digital-to-analog conversion, the timer circuit is configured to:
   reset the set-reset latches of the delay stages of the ring oscillator and set the count value of the counter to a respective value determined as a function of the digital input signal;
   in response to the start-of-conversion signal, start the ring oscillator by setting the set-reset latch of a delay stage selected amongst the delay stages of the ring oscillator as a function of the digital input signal;
   compare the count value of the counter with a reference value; and
   in response to the comparison, generate the ramp stop signal when the count value of the counter reaches the reference value.

8. The converter circuit according to claim 7, wherein the timer circuit is configured to set the count value of the counter to the respective value comprises setting the count value of the counter the most significant bits of the digital input signal.

9. The converter circuit according to claim 7, wherein the counter is configured to generate a carry/overflow signal, and wherein the timer circuit is configured to generate the ramp stop signal when the count value of the counter reaches the reference value by generating the ramp stop signal when the carry/overflow signal is set.

10. The converter circuit according to claim 2, wherein each delay stage of the ring oscillator further comprises:
a delay line connected to the input terminal of the respective delay stage, the delay line configured to provide a delayed version of the signal applied to the input terminal of the respective delay stage; and
a combinational logic circuit configured to generate the signal applied to the output terminal of the respective delay stage by combining the signal at the output of the delay line of the respective delay stage and the signal at the output terminal of the set-reset latch of the respective delay stage.

11. The converter circuit according to claim 1, wherein the input voltage corresponds to a voltage difference between a first voltage and a second voltage, and wherein, when the mode signal indicates an analog-to-digital conversion, the ramp generator is configured to:
apply the first voltage to a first node and apply the second voltage to a second node in response to the start-of-conversion signal, generate a first ramp signal by linearly decreasing the voltage at the first node and generate a second ramp signal by linearly increasing the voltage at the second node; and
generate via the comparator the timer stop signal when the voltage at the first node corresponds to and/or is smaller than the voltage at the second node.

12. The converter circuit according to claim 11, wherein, when the mode signal indicates a digital-to-analog conversion, the ramp generator is configured to:
apply a first reference voltage to the first node and apply a second reference voltage to the second node;
in response to the start-of-conversion signal, generate a first ramp signal by linearly decreasing the voltage at the first node and generate a second ramp signal by linearly increasing the voltage at the second node; and
in response to the ramp stop signal, determine the analog output voltage as a function of the voltage at the first node and the voltage at the second node.

13. The converter circuit according to claim 1, wherein the control circuit is configured to:
request a digital-to-analog conversion of the minimum value for the digital input signal to the converter circuit or request an analog-to-digital conversion of the maximum value for the analog input voltage to the converter circuit;
determine a first instant when the ramp stop signal is set and determine a second instant when the output of the comparator is set;
when the second instant is before the first instant, decrease the delay introduced by the delay stages of the ring oscillator or decrease a gradient of the ramp signal; and
when the second instant is after the first instant, increase the delay introduced by the delay stages of the ring oscillator or increase the gradient of the ramp signal.

14. The converter circuit according to claim 1, wherein the control circuit is configured to:
request a digital-to-analog conversion of a given value for the digital input signal to the converter circuit, thereby generating a respective analog output voltage; request an analog-to-digital conversion of the respective analog output voltage to the converter circuit, thereby generating a respective digital output signal; and
compare the given value for the digital input signal with the respective digital output signal.

15. The converter circuit according to claim 1, wherein the converter circuit is integrated into a single integrated circuit chip.

16. An electronic system comprising:
the converter circuit according to claim 1; and
a digital processing circuit configured to receive the digital output signal provided by the converter circuit or provide the digital input signal to the converter circuit.

17. A converter circuit configured to selectively convert an analog input voltage into a digital output signal or a digital input signal into an analog output voltage as a function of a mode signal;
wherein the converter circuit comprises a timer circuit, a ramp generator and a control circuit;
wherein the control circuit is configured to generate a start-of-conversion signal;
wherein the ramp generator is configured to:
monitor the start-of-conversion signal, and once the start-of-conversion signal is set:
when the mode signal indicates an analog-to-digital conversion, generate a timer stop signal via a variation of at least one ramp signal and a comparator after a time interval determined as a function of a value of the analog input voltage, thereby implementing an analog-to-time conversion; and
when the mode signal indicates a digital-to-analog conversion, vary the at least one ramp signal until a ramp stop signal is set and, in response to the ramp stop signal, determine the analog output voltage as a function of the at least one ramp signal, thereby implementing a time-to-analog conversion;
wherein the timer circuit is configured to:
monitor the start-of-conversion signal, and once the start-of-conversion signal is set:
when the mode signal indicates an analog-to-digital conversion, vary at least one count value until the timer stop signal is set and, in response to the timer stop signal, determine the digital output signal as a function of the at least one count value, thereby implementing a time-to-digital conversion;
when the mode signal indicates a digital-to-analog conversion, generate the ramp stop signal by varying the at least one count value after a time interval determined as a function of a value of the digital input signal, thereby implementing a digital-to-time conversion;
wherein the timer circuit comprises at least one counter providing the at least one count value, and a ring oscillator comprising a first delay stage, a plurality of intermediate delay stages and a last delay stage;
wherein each delay stage of the ring oscillator comprises:
an input terminal and an output terminal, the input terminal of each intermediate delay stage being connected to the output terminal of an upstream delay stage, the output terminal of each intermediate delay stage being connected to the input terminal of a downstream delay stage, wherein the output terminal of the last delay stage is connected to the input terminal of the first delay stage, and wherein the signal at the output terminal of the last delay stage corresponds to a clock signal used to increase the at least one counter; and a set-reset latch having a set terminal, a reset terminal and an output terminal, wherein the set terminal of the set-reset latch is connected to the input terminal of the respective delay stage, the reset terminal of the set-reset latch is connected to the output terminal of a downstream delay stage and the output terminal of the set-reset latch is connected to the output terminal of the respective delay stage;

wherein the timer circuit is configured to:

when the mode signal indicates an analog-to-digital conversion:

reset the set-reset latches of the delay stages of the ring oscillator and reset the at least one count value of the at least one counter;

in response to the start-of-conversion signal, start the ring oscillator by setting the set-reset latch of the first delay stage;

in response to the timer stop signal, stop the ring oscillator;

determine the digital output signal as a function of the at least one count value provided by the at least one counter and the signals at the output terminals of the set-reset latches; and when the mode signal indicates a digital-to-analog conversion:

reset the set-reset latches of the delay stages of the ring oscillator and set the at least one count value of the at least one counter to a respective value determined as a function of the digital input signal;

in response to the start-of-conversion signal, start the ring oscillator by setting the set-reset latch of a delay stage selected amongst the delay stages of the ring oscillator as a function of the digital input signal;

compare the at least one count value of the at least one counter with a reference value; and in response to the comparison, generate the ramp stop signal when the at least one count value of the at least one counter reaches the reference value.

18. A method of selectively converting an analog input voltage into a digital output signal or a digital input signal into an analog output voltage as a function of a mode signal, the method comprising:

receiving the mode signal at a first time to indicate an analog-to-digital conversion;

receiving the analog input voltage;

in response to the mode signal indicating the analog-to-digital conversion, generating a timer stop signal based on a ramp signal after a time interval determined as a function of a value of the analog input voltage;

varying a count value until the timer stop signal is set;

determining the digital output signal as a function of the count value when the timer stop signal is set;

receiving the mode signal at a second time to indicate a digital-to-analog conversion;

receiving the digital input signal;

in response to the mode signal indicating digital-to-analog conversion, generating a ramp stop signal by varying the count value after a time interval determined as a function of a value of the digital input signal;

varying the ramp signal until the ramp stop signal is set; and in response to the ramp stop signal, determining the analog output voltage as a function of the ramp signal.

19. The method according to claim 18, wherein the analog output voltage is determined using a counter and ring oscillator that includes a plurality of delay stages, and wherein, in response to the mode signal indicating digital-to-analog conversion, the method further comprises:

resetting latches of the plurality of delay stages;

setting a count value of the counter to a respective value determined as a function of the digital input signal;

receiving a start-of-conversion signal;

in response to the start-of-conversion signal, starting the ring oscillator by setting a latch of a delay stage selected amongst the plurality of delay stages as a function of the digital input signal;

comparing the count value of the counter with a reference value; and based on the comparing, generate the ramp stop signal when the count value of the counter reaches the reference value.

20. The method according to claim 18, wherein the digital output signal is determined using a counter and ring oscillator that includes a plurality of delay stages, and wherein, in response to the mode signal indicating analog-to-digital conversion, the method further comprises:

resetting latches of the plurality of delay stages;

resetting the count value of the counter;

receiving a start-of-conversion signal;

in response to the start-of-conversion signal, starting the ring oscillator by setting the latch of a first delay stage of the plurality of delay stages;

in response to the timer stop signal, stopping the ring oscillator; and determining the digital output signal as a function of the count value provided by the counter and signals at output terminals of the latches.

* * * * *